US012520593B2

(12) United States Patent
Kim

(10) Patent No.: US 12,520,593 B2
(45) Date of Patent: Jan. 6, 2026

(54) DISPLAY DEVICE

(71) Applicant: Samsung Display Co., LTD., Yongin-si (KR)

(72) Inventor: Keunwoo Kim, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/310,393

(22) Filed: May 1, 2023

(65) Prior Publication Data

US 2023/0395615 A1 Dec. 7, 2023

(30) Foreign Application Priority Data

Jun. 7, 2022 (KR) ........................ 10-2022-0068946

(51) Int. Cl.

*G09G 3/3233* (2016.01)
*H10D 86/40* (2025.01)
*H10D 86/60* (2025.01)

(52) U.S. Cl.

CPC ........... *H10D 86/60* (2025.01); *G09G 3/3233* (2013.01); *H10D 86/421* (2025.01); *H10D 86/481* (2025.01); *G09G 2300/0426* (2013.01); *G09G 2300/0819* (2013.01);

(Continued)

(58) Field of Classification Search

CPC ... G09G 2300/0426; G09G 2300/0819; G09G 2300/0852; G09G 2310/08; G09G 2320/0247; G09G 3/3233; G09G 2300/0814; G09G 2300/0866; G09G 2320/045; G09G 2320/046; G09G 3/32; G09G 2300/043; G09G 2300/0842; G09G 2330/021; G09G 2330/028; H10D 86/60; H10D 86/421; H10D 86/481; H10D 86/471; H10D 10/821; H10D 84/953

See application file for complete search history.

(56) References Cited

U.S. PATENT DOCUMENTS 10,903,248 B2 * 1/2021 Bae ...................... H10D 86/481
12,118,938 B2 * 10/2024 Guo ...................... G09G 3/3233
12,170,064 B2 * 12/2024 Guo ...................... G09G 3/3233

(Continued)

FOREIGN PATENT DOCUMENTS

CN 112419972 A 2/2021
KR 10-2012-0069137 A 6/2012

(Continued)

*Primary Examiner* — Ricardo Osorio

(74) *Attorney, Agent, or Firm* — Womble Bond Dickinson (US) LLP

(57) ABSTRACT

A display device includes: a light emitting element; a driving transistor configured to transmit a driving current to the light emitting element; a first dual transistor comprising a first sub transistor connected to a gate electrode of the driving transistor, and a second sub transistor configured to connect an input electrode of the first sub transistor and an output electrode of the driving transistor; an active layer comprising a first common area defining the input electrode of the first sub transistor and an output electrode of the second sub transistor; a first compensation electrode overlapping at least a portion of the first common area to define the first compensation capacitor; and a first compensation voltage line configured to provide a first compensation voltage to the first compensation electrode.

11 Claims, 25 Drawing Sheets

(52) U.S. Cl.
CPC . *G09G 2300/0852* (2013.01); *G09G 2310/08* (2013.01); *G09G 2320/0247* (2013.01); *H10D 86/471* (2025.01)

(56) References Cited

U.S. PATENT DOCUMENTS

| | | | | |
|---|---|---|---|---|
| 2015/0009108 | A1* | 1/2015 | Song | H10D 86/421 345/80 |
| 2017/0330928 | A1* | 11/2017 | Choi | H10D 86/481 |
| 2018/0144684 | A1* | 5/2018 | Jeon | G09G 3/3283 |
| 2018/0151123 | A1* | 5/2018 | Li | G09G 3/3233 |
| 2019/0164491 | A1* | 5/2019 | Kim | H10K 59/131 |
| 2019/0393291 | A1* | 12/2019 | Jeon | G09G 3/3233 |
| 2020/0013337 | A1* | 1/2020 | Cho | G09G 3/3233 |
| 2021/0057502 | A1 | 2/2021 | Kim et al. | |
| 2022/0051625 | A1* | 2/2022 | Lai | G09G 3/3266 |
| 2022/0262881 | A1* | 8/2022 | Kim | H01L 27/1237 |

FOREIGN PATENT DOCUMENTS

| | | | |
|---|---|---|---|
| KR | 10-2012-0074422 | A | 7/2012 |
| KR | 10-2020-0015862 | A | 2/2020 |
| KR | 10-2021-0022807 | A | 3/2021 |

* cited by examiner

T3:T3a,T3b
T4:T4a,T4b

C1a:G1,G2,G3,G4,EM,GB

C2a:CE,CM

C3a:BR1,BR2,BR3,BR4,BR5,GI,GW,GC,C-GC,ELVDD_H,VAINT_H,VBIAS

C4a:DATA,ELVDD_V,VAINT_V,VINT
ELVDD:ELVDD_H,ELVDD_V
VAINT:VAINT_H,VAINT_V

T3:T3a,T3b
T4:T4a,T4b

C2b:CE,CM'

C3b:BR1,BR2,BR3,BR4,BR5,GI,GW,GC,C-GI,ELVDD_H,VAINT_H,VBIAS

T3:T3a,T3b
T4:T4a,T4b

C2c:CE,CM,CM'

C3c:BR1,BR2,BR3,BR4,BR5,GI,GW,GC,C-GI,C-GC,ELVDD_H,VAINT_H,VBIAS

T3:T3a,T3b
T4:T4a,T4b

C1b:G1,G2,G3,G4,EM',GB

C3d:BR1,BR2,BR3,BR4,BR5,GI,GW,GC,CC,ELVDD_H,VAINT_H,VBIAS

T3:T3a,T3b
T4:T4a,T4b

C3e:BR1,BR2,BR3,BR4,BR5,GI,GW,GC,CC,C-GI,ELVDD_H,VAINT_H,VBIAS

DISPLAY DEVICE

CROSS-REFERENCE TO RELATED APPLICATION

The present application claims priority to and the benefit of Korean Patent Application No. 10-2022-0068946, filed on Jun. 7, 2022, filed in the Korean Patent Application Office, the entire content of which is hereby incorporated by reference.

BACKGROUND

1. Field

Aspects of some embodiments relate to a display device.

2. Description of the Related Art

Electronic devices such as smart phones, computers, and tablet PCs may include a display device. Recently, in order to minimize or reduce battery consumption of electronic devices, there is a growing demand for a technology that reduces power consumption of display devices. Accordingly, a low-frequency driving method for driving the display device at a relatively low frequency is being studied.

When the display device is driven at a relatively low frequency (for example, when a period of one frame is relatively long), leakage current in a pixel circuit may increase. Accordingly, a difference in luminance of pixels may occur between successive frames, and a flicker phenomenon may occur in an image displayed on the display device.

The above information disclosed in this Background section is only for enhancement of understanding of the background and therefore the information discussed in this Background section does not necessarily constitute prior art.

SUMMARY

Aspects of some embodiments include a display device with relatively improved low frequency characteristics.

A display device according to some embodiments of the present invention may include a light emitting element, a driving transistor which transmits a driving current to the light emitting element, a first dual transistor including a first sub transistor connected to a gate electrode of the driving transistor, and a second sub transistor connecting an input electrode of the first sub transistor and an output electrode of the driving transistor, an active layer including a first common area defining the input electrode of the first sub transistor and an output electrode of the second sub transistor, a first compensation electrode overlapping at least a portion of the first common area to define the first compensation capacitor, and a first compensation voltage line providing a first compensation voltage to the first compensation electrode.

According to some embodiments, during a first period in which a voltage applied to a gate electrode of the first dual transistor changes from a first turn-on voltage to a first turn-off voltage, the first compensation voltage may change from a first voltage to a second voltage, and a value obtained by multiplying a value obtained by subtracting the first voltage from the second voltage and a value obtained by subtracting the first turn-on voltage from the first turn-off voltage may have a negative value.

According to some embodiments, a planar area of an area where the first common area and the first compensation electrode overlap each other may be larger than a planar area of an area where the active layer and a gate electrode of the first dual transistor overlap each other.

According to some embodiments, the display device may further include a second dual transistor including a third sub transistor connected to the gate electrode of the driving transistor, and a fourth sub transistor connected to an input electrode of the third sub transistor and an initialization voltage line.

According to some embodiments, an output electrode of the third sub transistor may be connected to an output electrode of the first sub transistor.

According to some embodiments, the active layer may further include a second common area defining the input electrode of the third sub transistor and an output electrode of the fourth sub transistor.

According to some embodiments, the display device may further include a second compensation electrode overlapping at least a portion of the second common area to define a second compensation capacitor, and a second compensation voltage line providing a second compensation voltage to the second compensation electrode, and spaced apart from the first compensation voltage line.

According to some embodiments, during a second period in which a voltage applied to a gate electrode of the second dual transistor changes from a second turn-on voltage to a second turn-off voltage, the second compensation voltage may change from a third voltage to a fourth voltage, and a value obtained by multiplying a value obtained by subtracting the third voltage from the fourth voltage and a value obtained by subtracting the second turn-on voltage from the second turn-off voltage may have a negative value.

A display device according to some embodiments of the present invention may include a light emitting element, a driving transistor which transmits a driving current to the light emitting element, a second dual transistor including a third sub transistor connected to a gate electrode of the driving transistor, and a fourth sub transistor connected to an input electrode of the third sub transistor and an initialization voltage line, an active layer including a second common area defining the input electrode of the third sub transistor and an output electrode of the fourth sub transistor, a second compensation electrode overlapping at least a portion of the second common area to define a second compensation capacitor, and a second compensation voltage line providing a second compensation voltage to the second compensation electrode.

According to some embodiments, during a second period in which a voltage applied to a gate electrode of the second dual transistor changes from a second turn-on voltage to a second turn-off voltage, the second compensation voltage may change from a third voltage to a fourth voltage, and a value obtained by multiplying a value obtained by subtracting the third voltage from the fourth voltage and a value obtained by subtracting the second turn-on voltage from the second turn-off voltage may have a negative value.

According to some embodiments, a planar area of an area where the second common area and the second compensation electrode overlap each other may be larger than a planar area of an area where the active layer and a gate electrode of the second dual transistor overlap each other.

A display device according to some embodiments of the present invention may include a light emitting element, a driving transistor which transmits a driving current to the light emitting element, a first dual transistor including a first sub transistor connected to a gate electrode of the driving transistor, and a second sub transistor connecting an input electrode of the first sub transistor and an output electrode of the driving transistor, a light emitting control transistor connected to the driving transistor, an active layer including a first common area defining the input electrode of the first sub transistor and an output electrode of the second sub transistor, a first compensation electrode overlapping at least a portion of the first common area to define the first compensation capacitor, and a light emitting control line providing a light emitting control voltage to the first compensation electrode and a gate electrode of the light emitting control transistor.

According to some embodiments, during a first period in which a voltage applied to a gate electrode of the first dual transistor changes from a first turn-on voltage to a first turn-off voltage, the light emitting control voltage may change from a first voltage to a second voltage, and a value obtained by multiplying a value obtained by subtracting the first voltage from the second voltage and a value obtained by subtracting the first turn-on voltage from the first turn-off voltage may have a negative value.

According to some embodiments, a planar area of an area where the first common area and the first compensation electrode overlap each other may be larger than a planar area of an area where the active layer and a gate electrode of the first dual transistor overlap each other.

According to some embodiments, the light emitting control transistor may include a first light emitting control transistor connecting a first power voltage line providing a first power voltage and an input electrode of the driving transistor, and a second light emitting control transistor connecting an output electrode and the light emitting element.

According to some embodiments, the display device may further include a second dual transistor including a third sub transistor connected to the gate electrode of the driving transistor, and a fourth sub transistor connected to an input electrode of the third sub transistor and an initialization voltage line.

According to some embodiments, an output electrode of the third sub transistor may be connected to an output electrode of the first sub transistor.

According to some embodiments, the active layer may further include a second common area defining the input electrode of the third sub transistor and an output electrode of the fourth sub transistor.

According to some embodiments, the display device may further include a second compensation electrode overlapping at least a portion of the second common area to define a second compensation capacitor, and a second compensation voltage line providing a second compensation voltage to the second compensation electrode, and spaced apart from the first compensation voltage line.

According to some embodiments, during a second period in which a voltage applied to a gate electrode of the second dual transistor changes from a second turn-on voltage to a second turn-off voltage, the second compensation voltage may change from a third voltage to a fourth voltage, and a value obtained by multiplying a value obtained by subtracting the third voltage from the fourth voltage and a value obtained by subtracting the second turn-on voltage from the second turn-off voltage may have a negative value.

A display device according to some embodiments may include a first compensation electrode overlapping at least a portion of a first common area of an active layer to define a first compensation capacitor, and a first compensation voltage line providing a first compensation voltage to the first compensation electrode. The first compensation electrode and the first compensation voltage may serve to reduce a leakage current in the first common area, and accordingly, low frequency characteristics of the display device may be relatively improved.

A display device according to some embodiments may include a second compensation electrode overlapping at least a portion of a second common area of an active layer to define a second compensation capacitor, and a second compensation voltage line providing a second compensation voltage to the second compensation electrode. The second compensation electrode and the second compensation voltage may serve to reduce a leakage current in the second common area, and accordingly, low frequency characteristics of the display device may be relatively improved.

A display device according to some embodiments may include a first compensation electrode overlapping at least a portion of a first common area of an active layer to define a first compensation capacitor, and a light emitting control line providing a light emitting control voltage to the first compensation electrode. The first compensation electrode and the light emitting control voltage may serve to reduce a leakage current in the first common area, and accordingly, low frequency characteristics of the display device may be relatively improved.

BRIEF DESCRIPTION OF THE DRAWINGS

Illustrative, non-limiting embodiments will be more clearly understood from the following detailed description in conjunction with the accompanying drawings.

DETAILED DESCRIPTION

Figure 1:
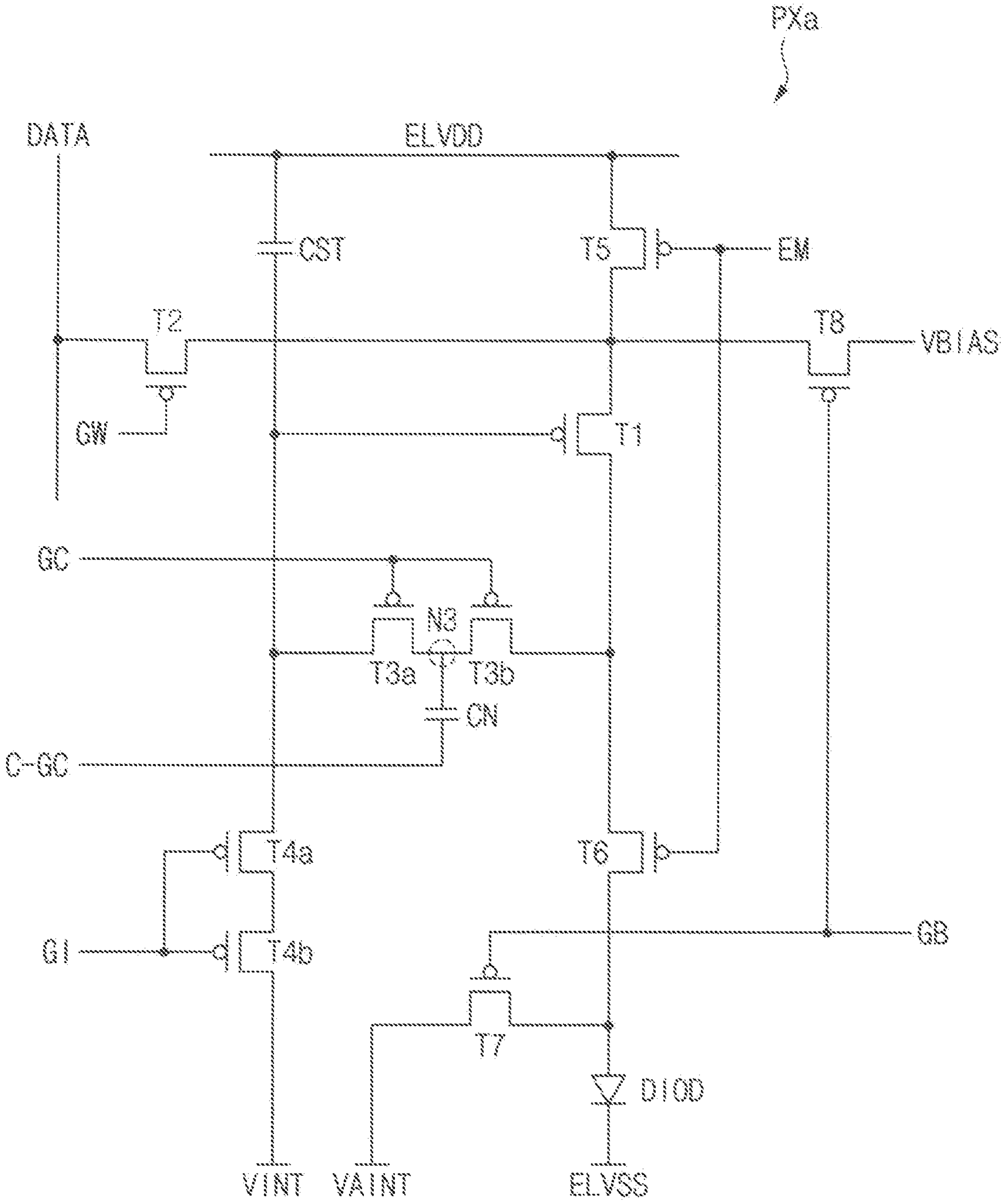
FIG. 1, FIG. 2, FIG. 3, FIG. 4, FIG. 5, FIG. 6, FIG. 7, and FIG. 8 are diagrams illustrating a display device according to some embodiments.

Hereinafter, aspects of some embodiments of the present disclosure will be explained in more detail with reference to the accompanying drawings. The same reference numerals are used for the same components in the drawings, and redundant descriptions of the same components will be omitted.

FIG. 1 is a circuit diagram illustrating a pixel included in a display device according to some embodiments.

Referring to FIG. 1, the display device according to some embodiments may include a pixel PXa. Although a single pixel PXa is illustrated in FIG. 1, a person having ordinary skill in the art would recognize that a display panel comprising the pixel PXa may include a plurality of pixels with the same or similar structure as that of the pixel PXa. The plurality of pixels may be arranged, for example, in a matrix configuration, of a plurality of rows and columns of pixels, and may include any suitable number of pixels according to the design of the display device.

The pixel PXa may be defined as a minimum unit for emitting light. The pixel PXa may include a pixel circuit and a light emitting element DIOD. The pixel circuit may include a plurality of transistors and at least one capacitor. Embodiments according to the present disclosure are not limited to the pixel structure illustrated in FIG. 1. For example, in some embodiments, the pixel circuit of the pixel PXa may include additional components or fewer components without departing from the spirit and scope of embodiments according to the present disclosure.

According to some embodiments, the pixel circuit of the pixel PXa may include a driving transistor, at least one switching transistor, and storage capacitor CST. For example, the pixel circuit may include a first transistor T1 referred to as the driving transistor, a second transistor T2 configured to provide a data voltage to the first transistor T1, a third transistor T3 electrically connecting an output electrode of the first transistor T1 and a gate electrode of the first transistor T1, a storage capacitor CST, and a first compensation capacitor CN.

According to some embodiments, the pixel circuit may further include at least one other switching transistor. For example, the pixel circuit may further include a fourth transistor T4, a fifth transistor T5, a sixth transistor T6, a seventh transistor T7, and an eight transistor T8.

An input electrode of the first transistor T1 may be connected to the data voltage line DATA, and the output electrode of the first transistor T1 may be connected to the light emitting element DIOD. The first transistor T1 may receive the data voltage from the data voltage line DATA and generate a driving current corresponding to the data voltage. The first transistor T1 may transmit the driving current to the light emitting element DIOD.

An input electrode of the second transistor T2 may be connected to the data voltage line DATA, and an output electrode of the second transistor T2 may be connected to the input electrode of the first transistor T1. A gate electrode of the second transistor T2 may be connected to a gate voltage line GW, and accordingly, the second transistor T2 may be turned on by a first gate voltage provided by the first gate voltage line GW. During a period in which the second transistor T2 is turned on, the second transistor T2 may provide the data voltage to the first transistor T1.

The third transistor T3 may include a first sub transistor T3*a* and a second sub transistor T3*b* electrically connected to the first sub transistor T3*a* through a first common node N3. In other words, the third transistor T3 may be a dual transistor having a dual gate structure. In this case, the third transistor T3 may be referred as a first dual transistor.

An input electrode of the first sub transistor T3*a* may be connected to an output electrode of the second sub transistor T3*b*, and an output electrode of the first sub transistor T3*a* may be connected to the gate electrode of the first transistor T1, and an input electrode of the second sub transistor T3*b* may be connected to the output electrode of the first transistor T1. A gate electrode of the third transistor T3 may be connected to the second gate voltage line GC, and accordingly, the third transistor T3 may be turned on by a second gate voltage provided by the second gate voltage line GC. During a period in which the third transistor T3 is turned on, the third transistor T3 may compensate a threshold voltage of the first transistor T1 by diode-connecting the first transistor T1.

The fourth transistor T4 may include a third sub transistor T4*a* and a fourth sub transistor T4*b* electrically connected to the third sub transistor T4*a*. In other words, the fourth transistor T4 may be a dual transistor having a dual gate structure. In this case, the fourth transistor T4 may be referred as a second dual transistor.

An output electrode of the third sub transistor T4*a* may be connected to the gate electrode of the first transistor T1, and an input electrode of the third sub transistor T4*a* may be connected to an output electrode of the fourth sub transistor T4*b*, and an input electrode of the fourth sub transistor T4*b* may be connected to an initialization voltage line VINT. A gate electrode of the fourth transistor T4 may be connected to a third gate voltage line GI, and accordingly, the fourth transistor T4 may be turned on by a third gate voltage provided by the third gate voltage line GI. During a period in which the fourth transistor T4 is turned on, the fourth transistor T4 may provide an initialization voltage provided by the initialization voltage line VINT to the gate electrode of the first transistor T1.

An input electrode of the fifth transistor T5 may be connected to a first power voltage line ELVDD, and an output electrode of the fifth transistor T1 may be connected to the input electrode of the first transistor T1. A gate electrode of the fifth transistor T5 may be connected to the light emitting control line EM, and accordingly, the fifth transistor T5 may be turned on by a light emitting control voltage provided by the light emitting control line EM. A period during a fifth transistor T5 is turned on, the fifth transistor T5 may provide a first power voltage provided by the first power voltage line ELVDD to the first transistor T1.

An input electrode of the sixth transistor T6 may be connected to the output electrode of the first transistor T1, and an output electrode of the sixth transistor T6 may be connected to the light emitting element DIOD. A gate electrode of the sixth transistor T6 may be connected to the light emitting control line EM, and accordingly, the sixth transistor T6 may be turned on by the light emitting control voltage. A period during the sixth transistor T6 is turned on, the sixth transistor T6 may provide the driving current to the light emitting element DIOD. According to some embodiments, the fifth transistor T5 and the sixth transistor T6 may be referred to as a first light emitting control transistor and a second light emitting control transistor.

An input electrode of the seventh transistor T7 may be connected to a light emitting initialization voltage line VAINT, and an output electrode of the seventh transistor T7 may be connected to the light emitting element DIOD. A gate electrode of the seventh transistor T7 may be connected to a fourth gate voltage line GB, and accordingly, the seventh transistor T7 may be turned on by a fourth gate voltage provided by the fourth gate voltage line GB. A period during the seventh transistor T7 is turned on, the seventh transistor T7 may provide a light emitting initialization voltage provide by the light emitting initialization voltage line VAINT to the light emitting element DIOD.

An input electrode of the eight transistor T8 may be connected to a bias voltage line VBIAS, and an output electrode of the eight transistor T8 may be connected to the input electrode of the first transistor T1. A gate electrode of the eight transistor T8 may be connected to the fourth gate voltage line GB, and accordingly, the eight transistor T8 may be turned on by the fourth gate voltage. A period during the eight transistor T8 is turned on, the eight transistor T8 may provide a bias voltage to the first transistor T1.

A first electrode of the storage capacitor CST may be connected to the gate electrode of the first transistor T1, and a second electrode of the storage capacitor CST may be connected to the first power voltage line ELVDD. The storage capacitor CST may maintain voltage level of the gate electrode of the first transistor T1 during an inactivation period of the first gate voltage provided by the first gate voltage line GW.

A first electrode of the first compensation capacitor CN may be connected to the first common node N3, and a second electrode of the first compensation capacitor CN may be connected to a first compensation voltage line C-GC providing a first compensation voltage. The first compensation capacitor CN and the first compensation voltage line C-GC may serve to maintain relatively constant voltage at the first common node N3. Accordingly, a leakage current of the third transistor T3 having the dual gate structure may be relatively reduced, and low frequency characteristics of the display device may be relatively improved.

A first electrode (for example, an anode electrode) of the light emitting element DIOD may be connected to the output electrode of the sixth transistor T6, and a second electrode (for example, a cathode electrode) of the light emitting element DIOD may be connected to the second power voltage line ELVSS. The first electrode of the light emitting element DIOD may receive the driving current, and the light emitting element DIOD may generate light having a luminance corresponding to the driving current.

Figure 2:
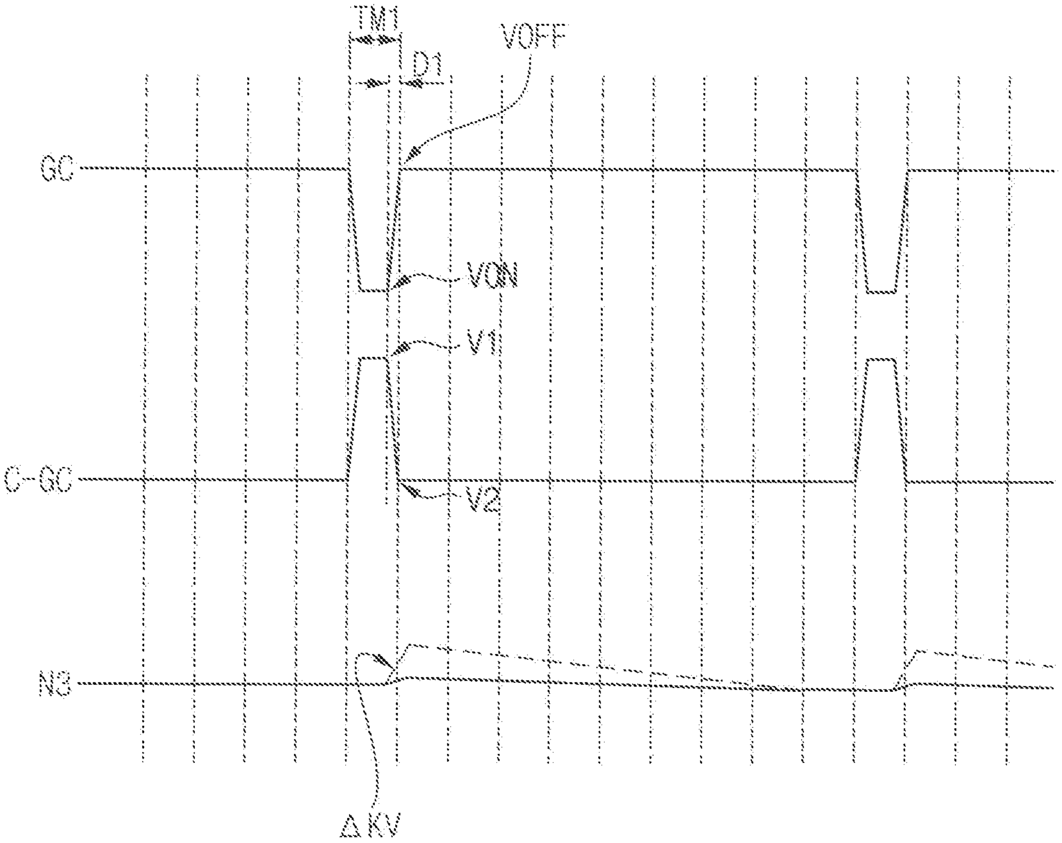

FIG. 2 is a waveform diagram illustrating an example in which the pixel of FIG. 1 operates. In FIG. 2, an example in which the first sub transistor T3*a* and the second sub transistor T3*b* are P-MOS transistors will be described, but the present invention is not limited thereto. For example, the first sub transistor T3*a* and the second sub transistor T3*b* may be N-MOS transistors.

Referring to FIG. 2, during a first timing TM1, the second gate voltage provided from the second gate voltage line GC may change from a first turn-off voltage VOFF to ta first turn-on voltage VON, and then change from the first turn-on voltage VON to the first turn-off voltage VOFF. The first turn-off voltage VOFF may be a voltage which turns off the first sub transistor T3*a* and the second sub transistor T3*b*, and the first turn-on voltage VON is a voltage which turns on the first sub transistor T3*a* and the second sub transistor T3*b*.

During a partial period (for example, a first period D1) of the first timing TM1 in which the second gate voltage changes from the first turn-on voltage VON to the first turn-off voltage VOFF, a voltage at the first common node N3 may increase (for example, a kick-back voltage increase AKV). A leakage current may occur in the first sub transistor T3*a* and the second sub transistor T3*b* due to the kick-back voltage increase AKV, and accordingly, a voltage at the gate electrode of the first transistor T1 may increase, so that a flicker phenomenon may occur.

According to some embodiments, the first compensation capacitor CN connected to the first common node N3 may form a capacitance in the first common node N3, and accordingly, the kick-back voltage increase AKV at the first common node N3 may be suppressed.

In addition, according to some embodiments, the first compensation voltage may be provided to the second electrode of the first compensation capacitor CN. According to some embodiments, the first compensation voltage provided form the first compensation voltage line C-GC may change from a first voltage V1 to a second voltage V2 during the first period D1. In this case, a value obtained by multiplying a value obtained by subtracting the first voltage V1 from the second voltage V2 and a value obtained by subtracting the first turn-on voltage VON from the first turn-off voltage VOFF may have a negative value. Accordingly, the first compensation voltage may compensate the second gate voltage during the first period D1 to suppress the kick-back voltage increase AKV at the first common node N3.

Figure 3:
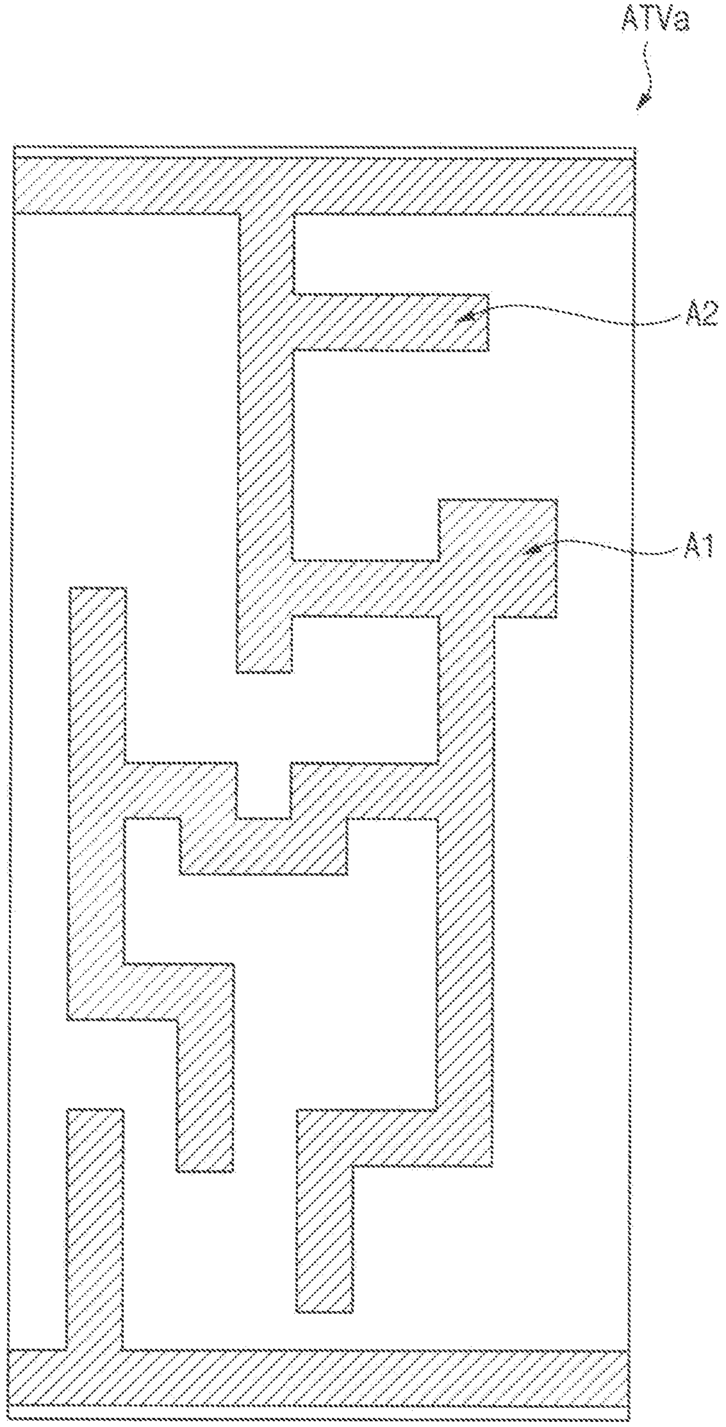
Figure 4:
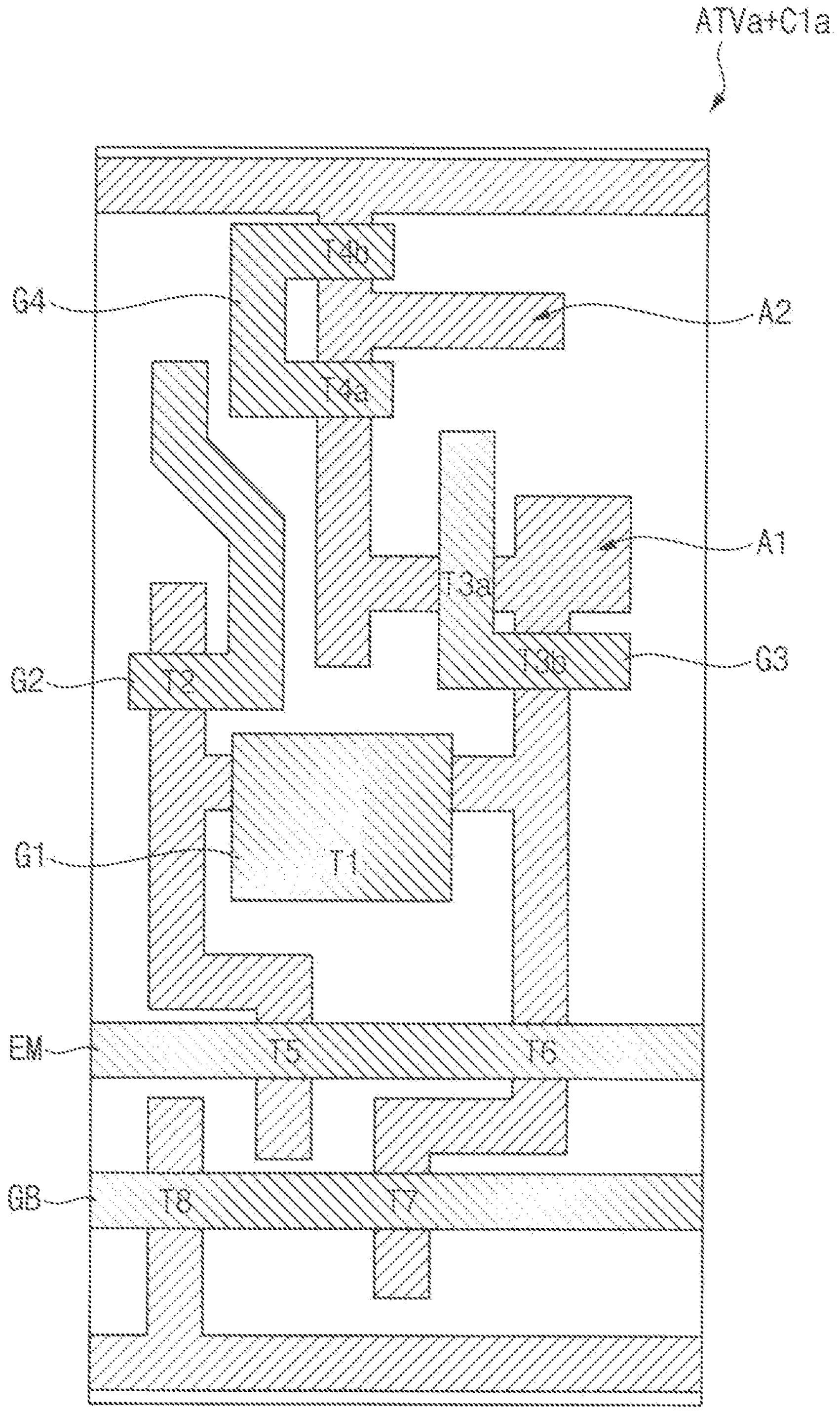

FIG. 3 and FIG. 4 are plan views illustrating an active layer ATVa and a first conductive layer C1*a* included in the pixel PXa of FIG. 1.

Referring to FIG. 3 and FIG. 4, the pixel PXa may include the active layer ATVa and the first conductive layer C1*a*.

The active layer ATVa may include a semiconductor material. For example, the active layer ATVa may include a silicon semiconductor or an oxide semiconductor.

In the active layer ATVa, an area overlapping the first conductive layer C1*a* may define a channel area of a transistor. In addition, in the active layer ATVa, an area which does not overlap the first conductive layer C1*a* may define an input electrode and an output electrode of a transistor.

The first conductive layer C1*a* may be located on the active layer ATVa. An insulation layer (for example, IL1 of FIG. 7) may be located between the first conductive layer C1*a* and the active layer ATVa. The first conductive layer C1*a* may include a conductive material.

The first conductive layer C1*a* may include a first gate electrode G1, a second gate electrode G2, a third gate electrode G3, a fourth gate electrode G4, the light emitting control line EM, and the fourth gate voltage line GB.

The first gate electrode G1 may be the gate electrode of the first transistor T1. In the active layer ATVa, an area overlapping the first gate electrode G1 may define a channel area of the first transistor T1.

The second gate electrode G2 may be the gate electrode of the second transistor T2. In the active layer ATVa, an area overlapping the second gate electrode G2 may define a channel area of the second transistor T2.

The third gate electrode G3 may be the gate electrode of the third transistor T3. In the active layer ATVa, an area overlapping the third gate electrode may define a channel area of the first sub transistor T3*a* and a channel area of the second sub transistor T3*b*. In this case, a first common area A1 of the active layer ATVa may be defined as the input electrode of the first sub transistor T3*a* and the output electrode of the second sub transistor T3*b*.

The fourth gate electrode G4 may be the gate electrode of the fourth transistor T4. In the active layer ATVa, an area overlapping the fourth gate electrode G4 may define a channel area of the third sub transistor T4*a* and a channel area of the fourth sub transistor T4*b*. In this case, a second common area A2 of the active layer ATVa may be defined as the input electrode of the third sub transistor T4*a* and the output electrode of the fourth sub transistor T4*b*.

The light emitting control voltage may be provided to the light emitting control line EM. In the light emitting control line EM, a portion overlapping the active layer ATVa may be the gate electrode of the fifth transistor T5 and the gate electrode of the sixth transistor T6. In addition, in the active layer ATVa, an area overlapping the light emitting control line EM may define a channel area of the fifth transistor T5 and a channel area of the sixth transistor T6.

The fourth gate voltage may be provided to the fourth gate voltage line GB. In the fourth gate voltage line GB, a portion overlapping the active layer ATVa may be the gate electrode of the seventh transistor T7 and the gate electrode of the eight transistor T8. In addition, in the active layer ATVa, an area overlapping the fourth gate voltage line GB may define a channel area of the seventh transistor T7 and a channel area of the eight transistor T8.

Figure 5:
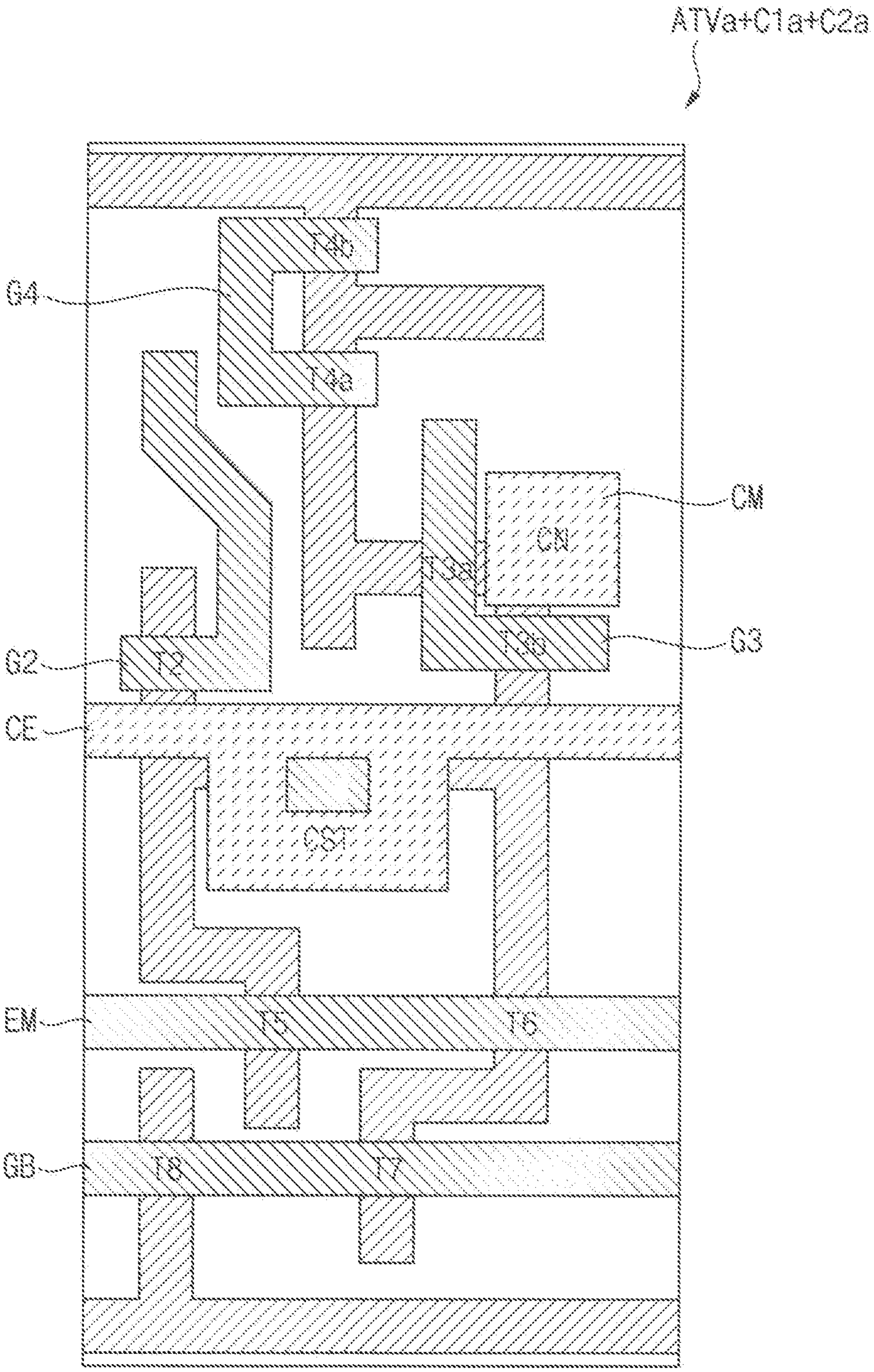

FIG. 5 is a plan view illustrating the active layer ATVa, the first conductive layer C1*a*, and a second conductive layer C2*a*.

Referring to FIG. 5, the second conductive layer C2*a* may be located on the first conductive layer C1*a*. An insulation layer (for example, IL2 of FIG. 7) may be located between the second conductive layer C2*a* and the first conductive layer C1*a*. The second conductive layer C2*a* may include a conductive material.

The second conductive layer C2*a* may include a capacitor electrode CE and a first compensation electrode CM.

The capacitor electrode CE may define the storage capacitor CST by overlapping the first gate electrode G1. In this case, the first gate electrode G1 may be the first electrode of the storage capacitor CST, and the capacitor electrode CE may be the second electrode of the storage capacitor CST.

The first compensation electrode CM may define the first compensation capacitor CN by overlapping the first common area A1 of the active layer ATVa. In this case, the first common area A1 of the active layer ATVa may be the first electrode of the first compensation capacitor CN, and the first compensation electrode CM may be the second electrode of the first compensation capacitor CN.

Figure 6:
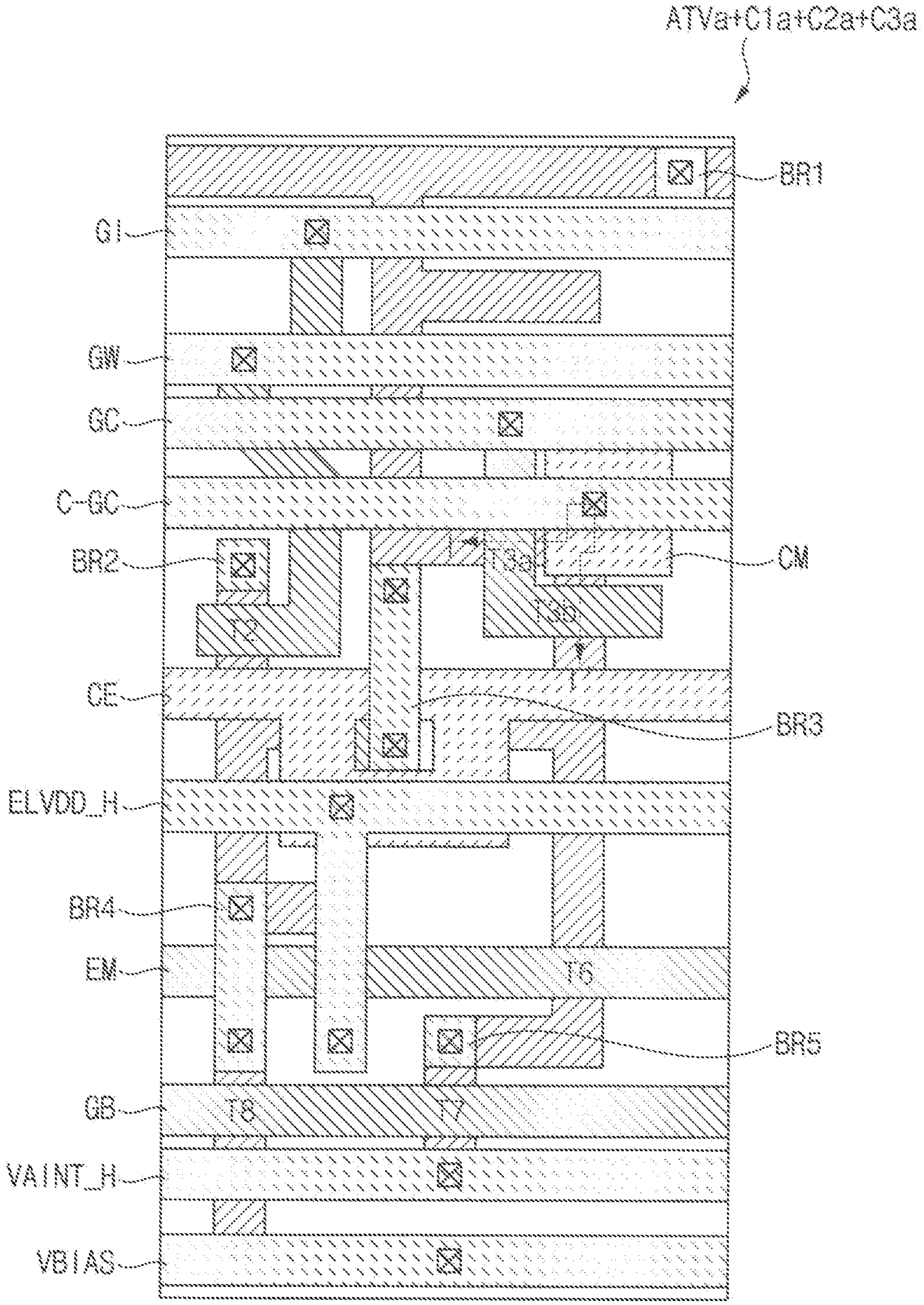

FIG. 6 is a plan view illustrating the active layer ATVa, the first conductive layer C1*a*, the second conductive layer C2*a*, and a third conductive layer C3*a*.

Referring to FIG. 6, the third conductive layer C3*a* may be located on the second conductive layer C2*a*. An insulation layer (for example, IL3 of FIG. 7) may be located between the third conductive layer C3*a* and the second conductive layer C2*a*. The third conductive layer C3*a* may include a conductive material.

The third conductive layer C3*a* may include a first bridge electrode BR1, a second bridge electrode BR2, a third bridge electrode BR3, a fourth bridge electrode BR4, a fifth bridge electrode BR5, the first gate voltage line GW, the second gate voltage line GC, the third gate voltage line GI, the first compensation voltage line C-GC, a first horizontal power voltage line ELVDD_H, a horizontal light emitting initialization voltage line VAINT_H, and the bias voltage line VBIAS.

The first bridge electrode BR1 may be connected to the input electrode of the fourth sub transistor T4*b*.

The second bridge electrode BR2 may be connected to the input electrode of the second transistor T2.

The third bridge electrode BR3 may be connected to the output electrode of the first sub transistor T3*a*, the output electrode of the third sub transistor T4*a*, and the first gate electrode G1.

The fourth bridge electrode BR4 may be connected to the input electrode of the first transistor T1, the output electrode of the fifth transistor T5, and the output electrode of the eight transistor T8.

The fifth bridge electrode BR5 may be connected to the output electrode of the sixth transistor T6 and the output electrode of the seventh transistor T7.

The first gate voltage may be provided to the first gate voltage line GW. The first gate voltage line GW may be connected to the second gate electrode G2.

The second gate voltage may be provided to the second gate voltage line GC. The second gate voltage line GC may be connected to the third gate electrode G3.

The third gate voltage may be provided to the third gate voltage line GI. The third gate voltage line GI may be connected to the fourth gate electrode G4.

The first compensation voltage may be provided to the first compensation voltage line C-GC. The first compensation voltage line C-GC may be connected to the first compensation electrode CM.

The first power voltage may be provided to the first horizontal power voltage line ELVDD_H. The first horizontal power voltage line ELVDD_H may be connected to the capacitor electrode CE and the input electrode of the fifth transistor T5.

The light emitting initialization voltage may be provided to the horizontal light emitting initialization voltage line VAINT_H. The horizontal light emitting initialization voltage line VAINT_H may be connected to the input electrode of the seventh transistor T7.

The bias voltage may be provided to the bias voltage line VBIAS. The bias voltage line VBIAS may be connected to the input electrode of the eight transistor T8.

Figure 7:
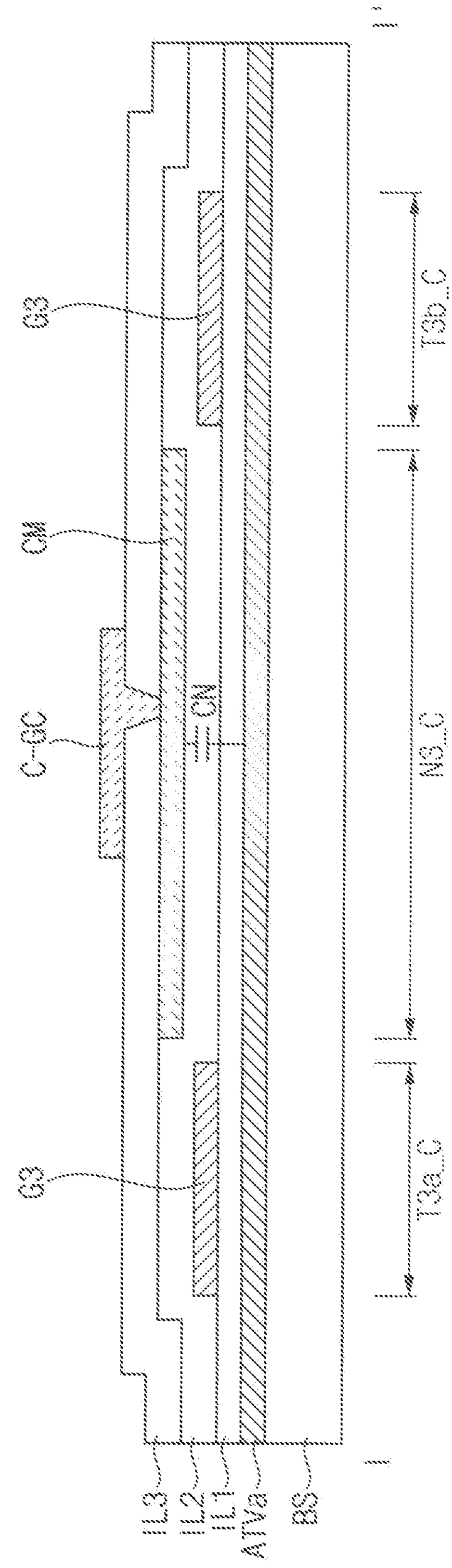

FIG. 7 is a cross-sectional view taken along a line I-I' of FIG. 6.

Referring to FIG. 7, the pixel PXa may include a base substrate BS, the active layer ATVa, a first insulation layer IL1, the third gate electrode G3, a second insulation layer IL2, the first compensation electrode CM, a third insulation layer 113, and a first compensation voltage line C-GC.

The base substrate BS may include glass, plastic, etc. According to some embodiments, the base substrate BS may include a material having flexibility, and accordingly, the base substrate BS may have flexibility.

The active layer ATVa may be located on the base substrate BS, and the first insulation layer IL1 may be located on the active layer ATVa. The first insulation layer IL1 may include an inorganic insulation material.

The third gate electrode G3 may be located on the first insulation layer IL1, and the second insulation layer IL2 may be located on the third gate electrode G3. The second insulation layer IL2 may include an inorganic insulation material.

The first compensation electrode CM may be located on the second insulation layer IL2, and the third insulation layer IL3 may be located on the first compensation electrode CM. The third insulation layer IL3 may include an inorganic insulation material.

The first compensation voltage line C-GC may be located on the third insulation layer 113. The first compensation voltage line C-GC may be connected to the first compensation electrode CM through a through hole penetrating the third insulation layer IL3 and exposing at least a portion of the first compensation electrode CM. Accordingly, the first compensation voltage line C-GC may provide the first compensation voltage to the first compensation electrode CM.

In the active layer ATVa, an area overlapping the third gate electrode G3 may define a channel area T3*a*_C of the first sub transistor T3*a* and a channel area T3*b*_C of the second sub transistor T3*b*.

In addition, in the first common area A1 of the active layer ATVa, an area overlapping the first compensation electrode CM may define a first overlapping area N3_C. The first overlap area N3_C may be the first compensation capacitor CN. In this case, as an planar area of the first overlapping area N3_C increases, a capacitance of the first compensation capacitor CN may increase.

According to some embodiment, the planar area of the first overlapping area N3_C may be relatively large so that the first compensation capacitor CN may have a relatively large capacitance. For example, the planar area of the first overlapping area N3_C may be larger than sum of a planar area of the channel area T3*a*_C of the first sub transistor T3*a* and a planar area of the channel area T3*b*_C of the second sub transistor T3*b*.

As described above, as the first compensation capacitor CN has a relatively large capacitance, the kick-back voltage increase AKV may be effectively suppressed.

Figure 8:
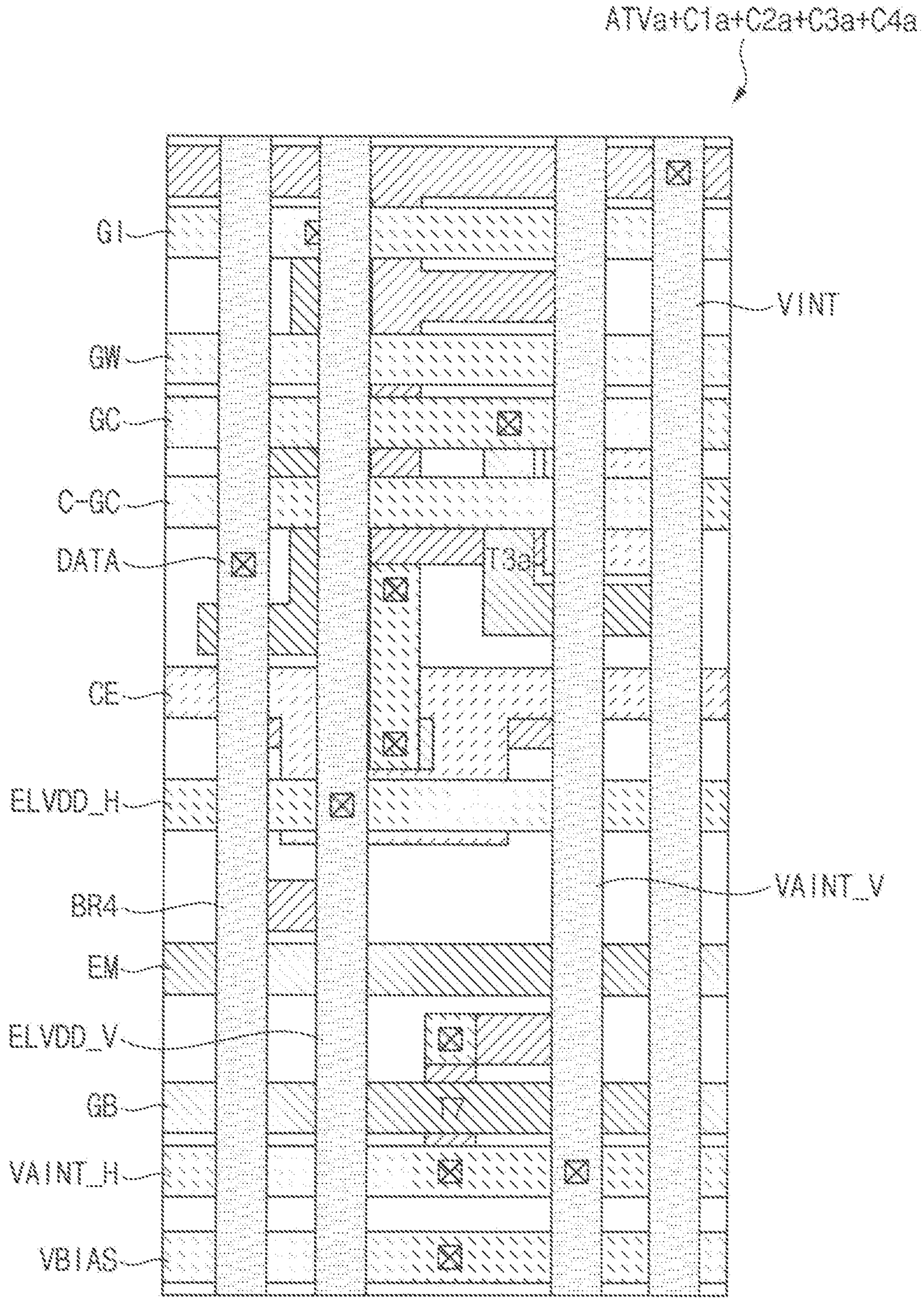

FIG. 8 is a plan view illustrating the active layer ATVa, the first conductive layer C1*a*, the second conductive layer C2*a*, the third conductive layer C3*a*, and a fourth conductive layer C4*a* included in the pixel PXa of FIG. 1.

The fourth conductive layer C4*a* may be located on the third conductive layer C3*a*. An insulation layer may be located between the fourth conductive layer C4*a* and the third conductive layer C3*a*. The fourth conductive layer C4*a* may include a conductive material.

The fourth conductive layer C4*a* may include the data voltage line DATA, a first vertical power voltage line ELVDD_V, a vertical light emitting initialization voltage line VAINT_V, and the initialization voltage line VINT.

The data voltage may be provided to the date voltage line DATA. The data voltage line DATA may be connected to the second bridge electrode BR2.

The first power voltage may be provided to the first vertical power voltage line ELVDD_V. The first vertical power voltage line ELVDD_V may be connected to the first horizontal power voltage line ELVDD_H. The first vertical power voltage line ELVDD_V and the first horizontal power voltage line ELVDD_H may define the first power voltage line ELVDD.

The light emitting initialization voltage may be provided to the vertical light emitting initialization voltage line VAINT_V. The vertical light emitting initialization voltage line VAINT_V may be connected to the horizontal light emitting initialization voltage line VAINT_H. The vertical light emitting initialization voltage line VAINT_V and the horizontal light emitting initialization voltage line VAINT_H may define the light emitting initialization voltage line VAINT.

The initialization voltage may be provided to the initialization voltage line VINT. The initialization voltage line VINT may be connected to the first bridge electrode BR1.

Figure 9:
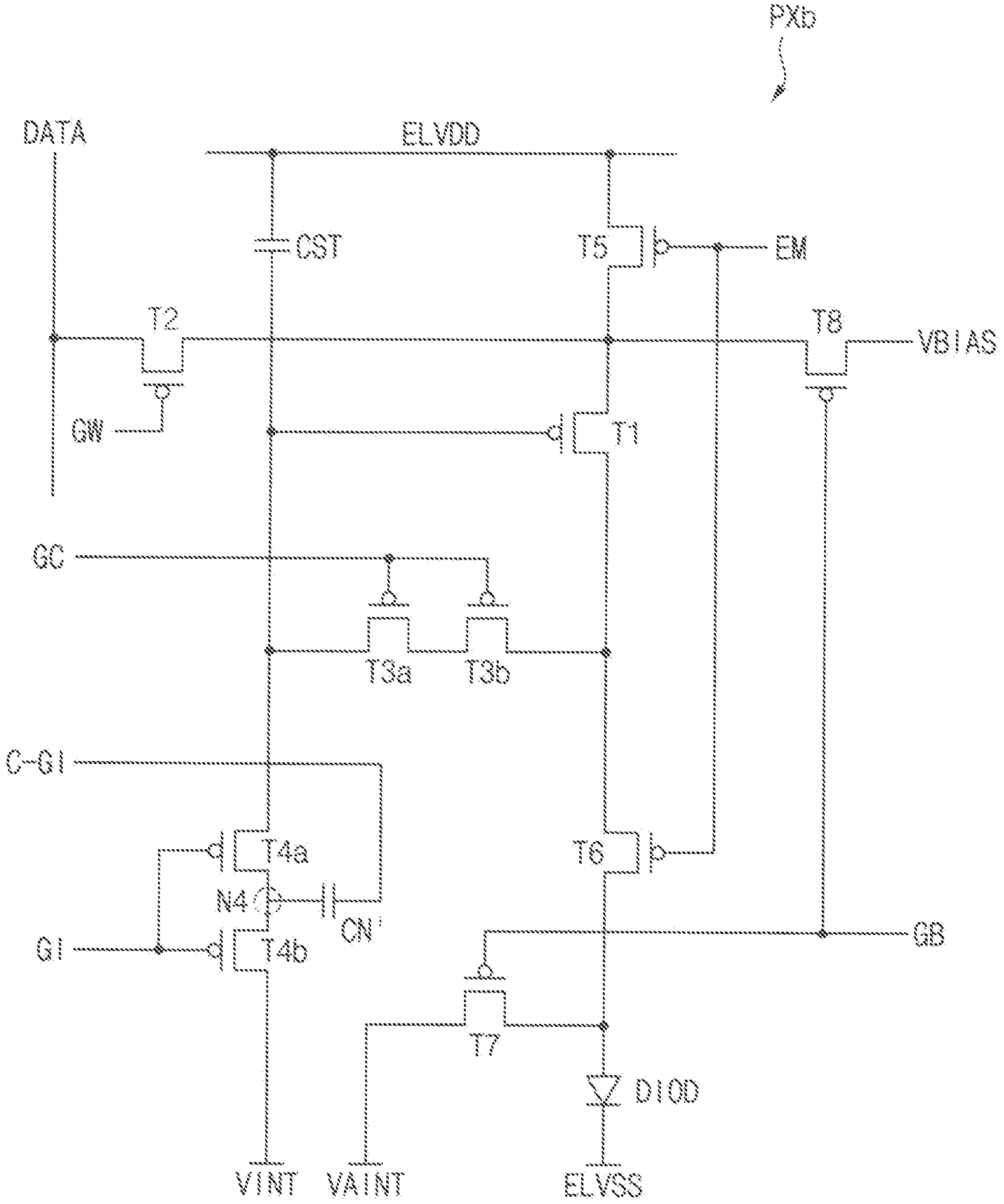
FIG. 9, FIG. 10, FIG. 11, FIG. 12, and FIG. 13 are diagrams illustrating a display device according to some embodiments.

FIG. 9 is a circuit diagram illustrating a pixel included in a display device according to some embodiments.

Referring to FIG. 9, the display device according to some embodiments may include a pixel PXb.

The pixel PXb may be defined as a minimum unit for emitting light. The pixel PXb may include a pixel circuit and a light emitting element DIOD. The pixel circuit may include a plurality of transistors and at least one capacitor.

According to some embodiments, the pixel circuit may include a driving transistor, at least one switching transistor, and a storage capacitor CST. For example, the pixel circuit may include a first transistor T1 referred to as the driving transistor, a second transistor T2 providing a data voltage to the first transistor T1, a fourth transistor T4 electrically connecting a gate electrode of the first transistor T1 and an initialization voltage line VINT, the storage capacitor CST, and a second compensation capacitor CN'.

Optionally, the pixel circuit may further include at least one other switching transistor. For example, the pixel circuit may further include a third transistor T3, a fifth transistor T5, a sixth transistor T6, a seventh transistor T7, and an eight transistor T8.

Hereinafter, description substantially same as or similar to that described with reference to FIG. 1 may be omitted.

The fourth transistor T4 may include a third sub transistor T4*a* and a fourth sub transistor T4*b*. The third sub transistor T4*a* and the fourth sub transistor T4*b* may be electrically connected to each other through a second common node N4. In other words, the fourth transistor T4 may be a dual transistor having a dual gate structure.

An input electrode of the third sub transistor T4*a* may be connected to an output electrode of the fourth sub transistor T4*b*, and an output electrode of the third sub transistor T4*a* may be connected to a gate electrode of the first transistor T1, and an input electrode of the fourth sub transistor T4*b* may be connected to the initialization voltage line VINT. Optionally, when the pixel circuit further includes the third transistor T3, the output electrode of the third sub transistor T4*a* may be connected to an output electrode of a first sub transistor T3*a*. A gate electrode of the fourth transistor T4 may be connected to a third gate voltage line GI, and accordingly, the fourth transistor T4 may be turned on by a third gate voltage provided by the third gate voltage line GI.

A first electrode of the second compensation capacitor CN' may be connected to the second common node N4, and a second electrode of the second compensation capacitor CN' may be connected to a second compensation voltage line C-GI providing a second compensation voltage. The second compensation capacitor CN' and the second compensation voltage line C-GI may serve to maintain relatively constant voltage at the second common node N4. Accordingly, a leakage current of the fourth transistor T4 having the dual gate structure may be reduced, and low frequency characteristics of the display device may be relatively improved.

Figure 10:
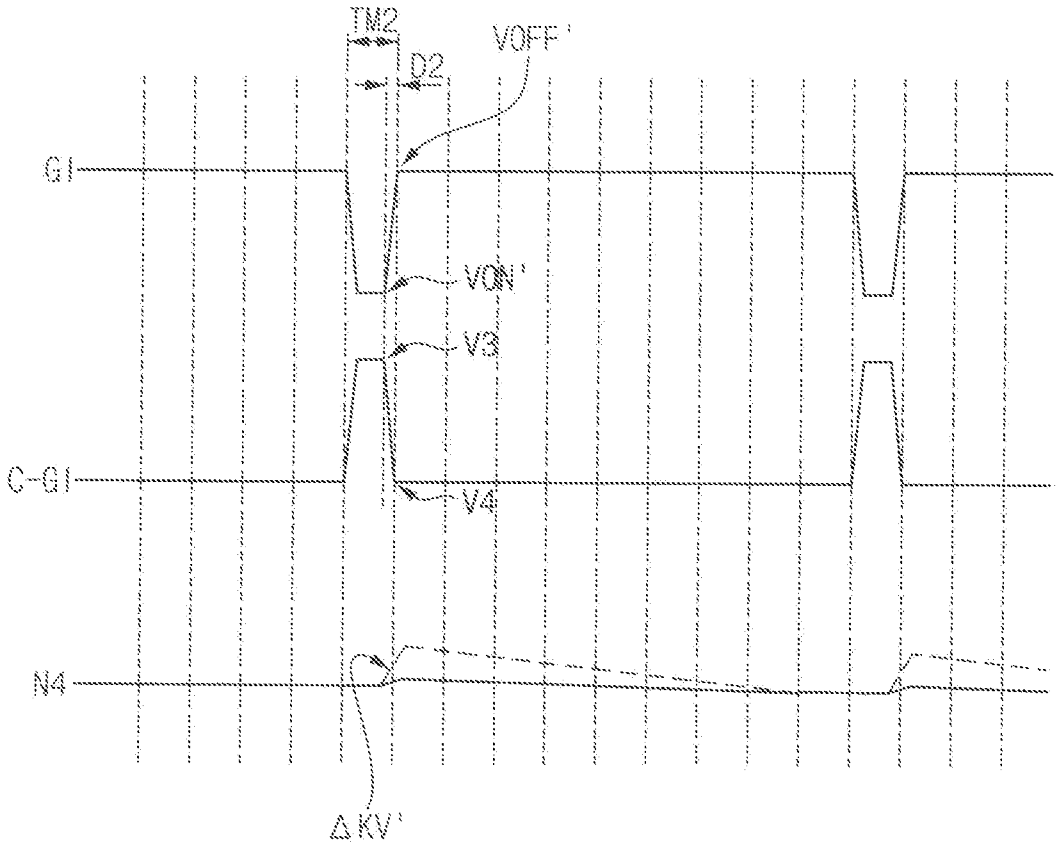

FIG. 10 is a waveform diagram illustrating an example in which the pixel of FIG. 9 operates. In FIG. 10, an example in which the third sub transistor T4*a* and the fourth sub transistor T4*b* are P-MOS transistors will be described, but embodiments according to the present invention are not limited thereto. For example, the third sub transistor T4*a* and the fourth sub transistor T4*b* may be N-MOS transistor.

Referring to FIG. 10, during a second timing TM2, the third gate voltage provided from the third gate voltage line GI may change from a second turn-off voltage VOFF' to a second turn-on voltage VON', and then change from the second turn-on voltage VON' to the second turn-off voltage VOFF. The second turn-off voltage VOFF may be a voltage which turns of the third sub transistor T4*a* and the fourth sub transistor T4*b*, and the second turn-on voltage VON' may be a voltage which turns on the third sub transistor T4*a* and the fourth sub transistor T4*b*.

During a partial period (for example, a second period D2) of the second timing TM2 in which the third gate voltage changes from the second turn-on voltage VON' to the second turn-off voltage VOFF, a voltage at the second common node N4 may increase (for example, a kick-back voltage increase AKV'). A leakage current may occur in the third sub transistor T4*a* and the fourth sub transistor T4*b* due to the kick-back voltage increase AKV', and accordingly, a voltage at the gate electrode of the first transistor T1 may increase, so that a flicker phenomenon may occur.

According to some embodiments, the second compensation capacitor CN' connected to the second common node N4 may form a capacitance in the second common node N4, and accordingly, the kick-back voltage increase AKV' at the second common node N4 may be suppressed.

In addition, according to some embodiments, the second compensation voltage may be provided to the second electrode of the second compensation capacitor CN'. According to some embodiments, the second compensation voltage provided form the second compensation voltage line C-GI may change from a third voltage V3 to the fourth voltage V4 during the second period D2. In this case, a value obtained by multiplying a value obtained by subtracting the third voltage V3 from the fourth voltage V4 and a value obtained by subtracting the second turn-on voltage VON' from the second turn-off voltage VOFF may have a negative value. Accordingly, the second compensation voltage may compensate the third gate voltage during the second period D2 to suppress the kick-back voltage increase AKV' at the fourth common node N4.

Figure 11:
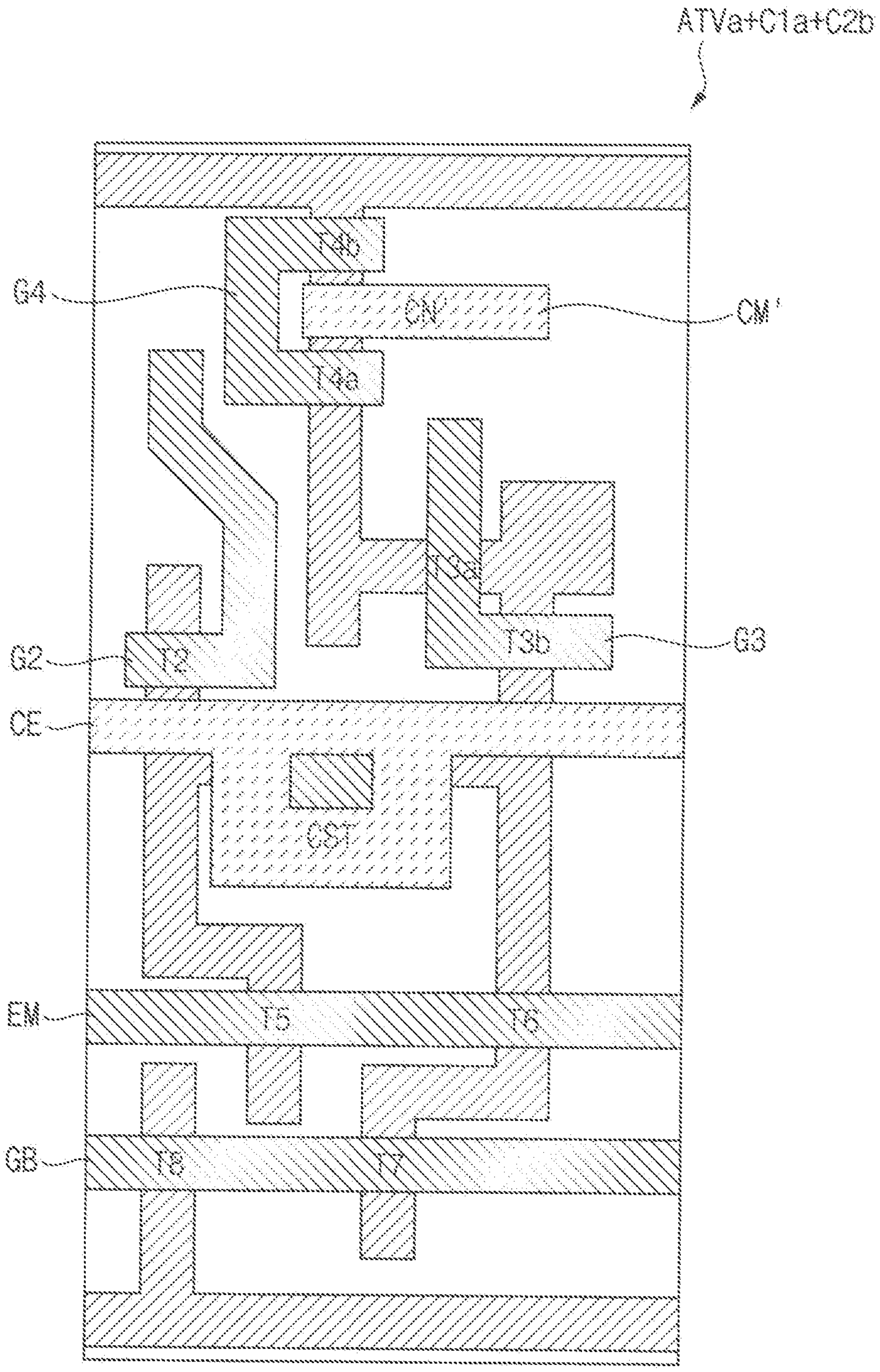

FIG. 11 is a plan view illustrating an active layer ATVa, a first conductive layer C1*a*, and a second conductive layer C2*b* included in the pixel PXb of FIG. 9.

Referring to FIG. 11, the pixel PXb may include the active layer ATVa, the first conductive layer C1*a*, and the second conductive layer C2*b*.

The active layer ATVa and the first conductive layer C1*a* included in the pixel PXb may be substantially same as the active layer ATVa and the first conductive layer C1*a* described with reference to FIG. 3 and FIG. 4.

The second conductive layer C2*b* may include a capacitor electrode CE and a second compensation electrode CM'.

The capacitor electrode CE included in the second conductive layer C2*b* may be substantially same as the capacitor electrode CE described with reference to FIG. 5.

The second compensation electrode CM' may overlap the second common area A2 to define the second compensation capacitor CN'. In this case, the second common area A2 of the active layer ATVa may be the first electrode of the second compensation capacitor CN', and the second compensation electrode CM' may be the second electrode of the second compensation capacitor CN'.

Figure 12:
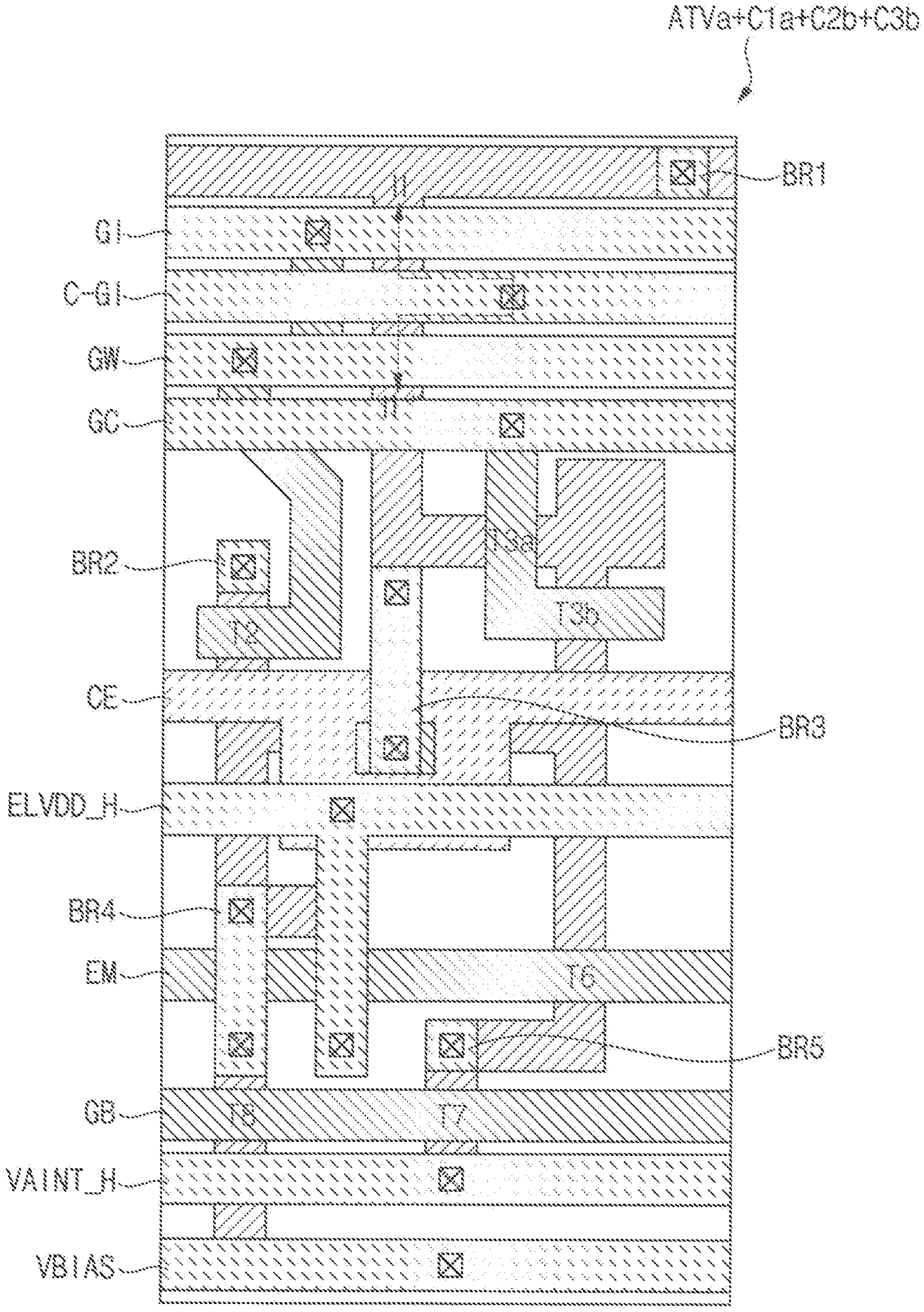

FIG. 12 is a plan view illustrating the active layer ATVa, the first conductive layer C1*a*, the second conductive layer C2*b*, and a third conductive layer C3*b* included in the pixel PXb of FIG. 9.

Referring to FIG. 12, the third conductive layer C3*b* may be located on the second conductive layer C2*b*. An insulation layer (for example, IL3 of FIG. 13) may be located between the third conductive layer C3*b* and the second conductive layer C2*b*. The third conductive layer C3*b* may include a conductive material.

The third conductive layer C3*b* may include a first bridge electrode BR1, a second bridge electrode BR2, a third bridge electrode BR3, a fourth bridge electrode BR4, a fifth bridge electrode BR5, a first gate voltage line GW, a second gate voltage line GC, the third gate voltage line GI, the second compensation voltage line C-GI, a first horizontal power voltage line ELVDD_H, a horizontal light emitting initialization line VAINT_H, and a bias voltage line VBIAS.

The first bridge electrode BR1, the second bridge electrode BR2, the third bridge electrode BR3, the fourth bridge electrode BR4, the fifth bridge electrode BR5, the first gate voltage line GW, the second gate voltage line GC, the third gate voltage line GI, the first horizontal power voltage line ELVDD_H, the horizontal light emitting initialization line VAINT_H, and the bias voltage line VBIAS included in the third conductive layer C3*b* may be substantially same as the first bridge electrode BR1, the second bridge electrode BR2, the third bridge electrode BR3, the fourth bridge electrode BR4, the fifth bridge electrode BR5, the first gate voltage line GW, the second gate voltage line GC, the third gate voltage line GI, the first horizontal power voltage line ELVDD_H, the horizontal light emitting initialization line VAINT_H, and the bias voltage line VBIAS described with reference to FIG. 5.

The second compensation voltage may be provided to the second compensation voltage line C-GI. The second compensation voltage line C-GI may be connected to the second compensation electrode CM'.

According to some embodiments, the fourth conductive layer C4*a* described with reference to FIG. 8 may be located on the third conductive layer C3*b*. In this case, an insulation layer may be located between the fourth conductive layer C4*a* and the third conductive layer C3*b*.

Figure 13:
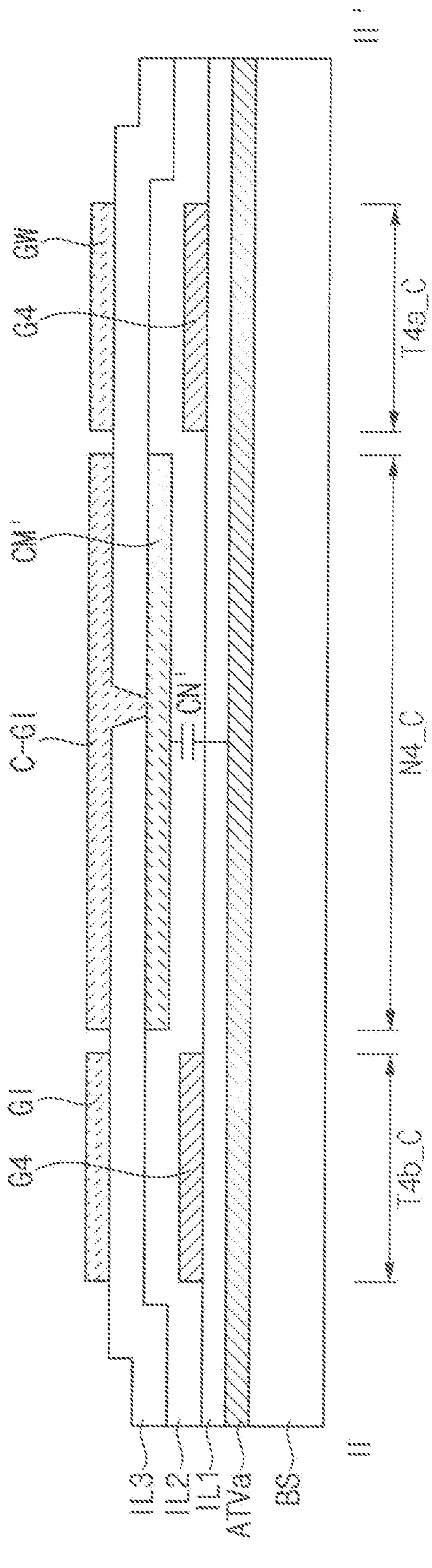

FIG. 13 is a cross-sectional view taken along a line II-II' of FIG. 12.

Referring to FIG. 13, the pixel PXb may include a base substrate BS, the active layer ATVa, a first insulation layer IL1, the fourth gate electrode G4, a second insulation layer 112, the second compensation electrode CM', a third insulation layer IL3, the first gate voltage line GW, the third gate voltage line GI, and the second compensation voltage line C-GI.

The base substrate BS may include glass, plastic, etc. According to some embodiments, the base substrate BS may include a material having flexibility, and accordingly, the base substrate BS may have flexibility.

The active layer ATVa may be located on the base substrate BS, and the first insulation layer IL1 may be located on the active layer ATVa. The first insulation layer IL1 may include an inorganic insulation material.

The fourth gate electrode G4 may be located on the first insulation layer IL1, and the second insulation layer IL2 may be located on the fourth gate electrode G4. The second insulation layer IL2 may include an inorganic insulation material.

The second compensation electrode CM' may be located on the second insulation layer IL2, and the third insulation layer IL3 may be located on the second compensation electrode CM'. The third insulation layer IL3 may include an inorganic insulation material.

The first gate voltage line GW, the third gate voltage line GI, and the second compensation voltage line C-GI may be located on the third insulation layer IL3. The second compensation voltage line C-GI may be connected to the second compensation electrode CM' through a through hole penetrating the third insulation layer IL3 and exposing at least a portion of the second compensation electrode CM'. Accordingly, the second compensation voltage line C-GI may provide the second compensation voltage to the second compensation electrode CM'.

In the active layer ATVa, an area overlapping the fourth gate electrode G4 may define a channel area T4*a*_C of the third sub transistor T4*a* and a channel area T4*b*_C of the fourth sub transistor T4*b*.

In addition, in the second common area A2 of the active layer ATVa, an area overlapping the second compensation electrode CM' may define a second overlapping area N4_C. The second overlapping area N4_C may be the first electrode of the second compensation capacitor CN'. In this case, as a planar area of the second overlapping area N4_C increases, capacitance of the second compensation capacitor CN' may increase.

According to some embodiments, the planar area of the second overlapping area N4_C may be relatively large so that the second compensation capacitor CN' may have a relatively large capacitance. For example, the planar area of the second overlapping area N4_C may be larger than sum of a planar area of the channel area T4*a*_C of the third sub transistor T4*a* and a planar area of the channel area T4*b*_C of the fourth sub transistor T4*b*.

As described above, as the second compensation capacitor CN' has a relatively large capacitance, the kick-back voltage increase AKV' may be effectively suppressed.

Figure 14:
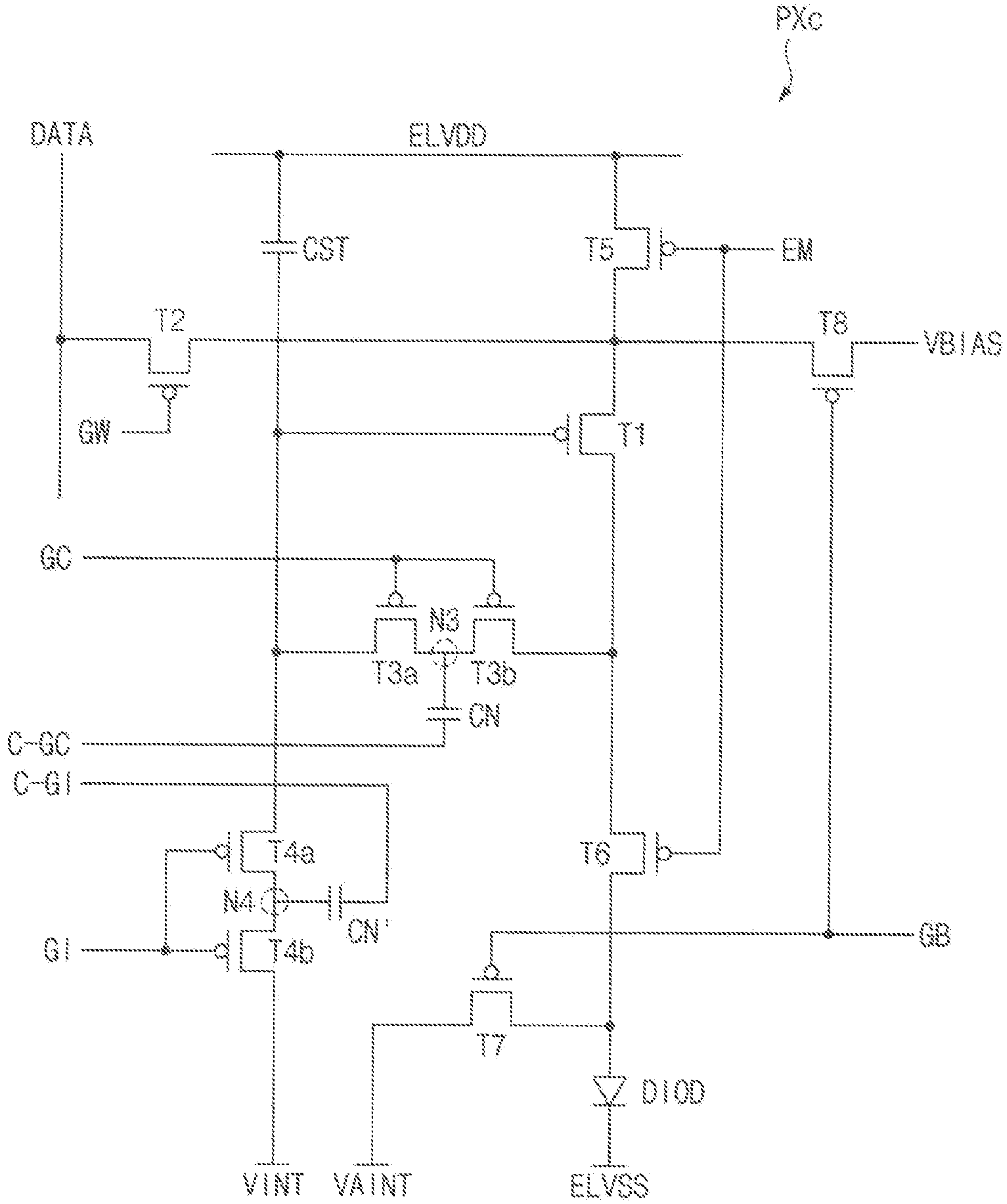
FIG. 14, FIG. 15, and FIG. 16 are diagrams illustrating a display device according to some embodiments.

FIG. 14 is a circuit diagram illustrating a pixel included in a display device according to some embodiments.

Referring to FIG. 14, the display device according to some embodiments may include a pixel PXc.

The pixel PXc may be defined as a minimum unit for emitting light. The pixel PXc may include a pixel circuit and a light emitting element DIOD. The pixel circuit may include a plurality of transistors and at least one capacitor.

According to some embodiments, the pixel circuit may include a driving transistor, at least one switching transistor, and a storage capacitor CST. For example, the pixel circuit may include a first transistor T1 referred to as the driving transistor, a second transistor T2 providing a data voltage to the first transistor T1, a third transistor T3 electrically connecting an output electrode of the first transistor T1 and a gate electrode of the first transistor T1, a fourth transistor T4 electrically connecting a gate electrode of the first transistor T1 and an initialization voltage line VINT, the storage capacitor CST, a first compensation capacitor CN, and a second compensation capacitor CN'.

Optionally, the pixel circuit may further include at least one other switching transistor. For example, the pixel circuit may further include a fifth transistor T5, a sixth transistor T6, a seventh transistor T7, and an eight transistor T8.

Hereinafter, description substantially same as or similar to that described with reference to FIG. 1 and FIG. 9 may be omitted.

The third transistor T3 may include a first sub transistor T3*a* and a second sub transistor T3*b* electrically connected to the first sub transistor T3*a* through a first common node N3. In other words, the third transistor T3 may be a dual transistor having a dual gate structure. In this case, the third transistor T3 may be referred as a first dual transistor.

A first electrode of the first compensation capacitor CN may be connected to the first common node N3, and a second electrode of the first compensation capacitor CN may be connected to a first compensation voltage line C-GC providing a first compensation voltage.

The third transistor T3, the first compensation capacitor CN, and the first compensation voltage line C-GC may be substantially same as the third transistor T3, the first compensation capacitor CN, and the first compensation voltage line C-GC described with reference to FIG. 1.

The first compensation capacitor CN and the first compensation voltage line C-GC may serve to maintain relatively constant voltage at the first common node N3 (Refer to FIG. 2). Accordingly, a leakage current of the third transistor T3 having the dual gate structure may be reduced, and low frequency characteristics of the display device may be relatively improved.

The fourth transistor T4 may include a third sub transistor T4*a* and a fourth sub transistor T4*b*. The third sub transistor T4*a* and the fourth sub transistor T4*b* may be electrically connected to each other through a second common node N4. In other words, the fourth transistor T4 may be a dual transistor having a dual gate structure.

A first electrode of the second compensation capacitor CN' may be connected to the second common node N4, and a second electrode of the second compensation capacitor CN' may be connected to a second compensation voltage line C-GI providing a second compensation voltage.

The fourth transistor T4, the second compensation capacitor CN', and the second compensation voltage line C-GI may be substantially same as the fourth transistor T4, the second compensation capacitor CN', and the second compensation voltage line C-GI described with reference to FIG. 9.

The second compensation capacitor CN' and the second compensation voltage line C-GI may serve to maintain relatively constant voltage at the second common node N4 (Refer to FIG. 10). Accordingly, a leakage current of the fourth transistor T4 having the dual gate structure may be reduced, and low frequency characteristics of the display device may be relatively improved.

Figure 15:
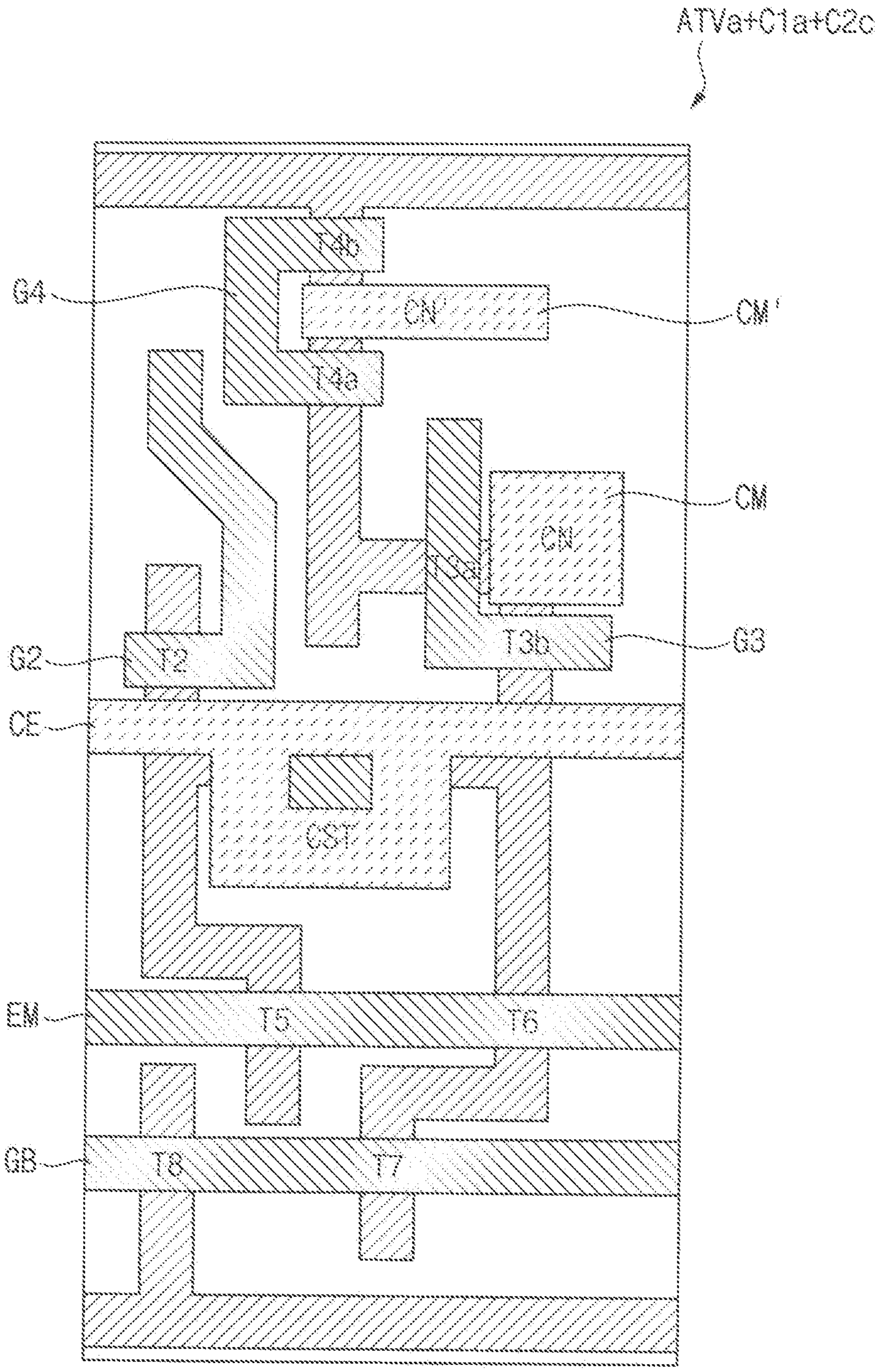

FIG. 15 is a plan view illustrating an active layer ATVa, a first conductive layer C1*a*, and a second conductive layer C2*c* included in the pixel PXc of FIG. 14.

Referring to FIG. 15, the pixel PXc may include the active layer ATVa, the first conductive layer C1*a*, and the second conductive layer C2*c*.

The active layer ATVa and the first conductive layer C1*a* included in the pixel PXc may be substantially same as the active layer ATVa and the first conductive layer C1*a* described with reference to FIG. 3 and FIG. 4.

The second conductive layer C2*c* may be located on the first conductive layer C1*a*. An insulation layer may be located between the second conductive layer C2*c* and the first conductive layer C1*a*. The second conductive layer C2*c* may include a conductive material.

The second conductive layer C2*c* may include a capacitor electrode CE, a first compensation electrode CM, and a second compensation electrode CM2.

The capacitor electrode CE included in the second conductive layer C2*c* may be substantially same as the capacitor electrode CE described with reference to FIG. 5.

The first compensation electrode CM included in the second conductive layer C2*c* may be substantially same as the first compensation electrode CM described with reference to FIG. 5. That is, the first compensation electrode CM may overlap the first common area A1 of the active layer ATVa to define the first compensation capacitor CN.

The second compensation electrode CM' included in the second conductive layer C2*c* may be substantially same as the second compensation electrode CM' described with reference to FIG. 11. That is, the second compensation electrode CM' may overlap the second common area A2 of the active layer ATVa to define the second compensation capacitor CN'.

Figure 16:
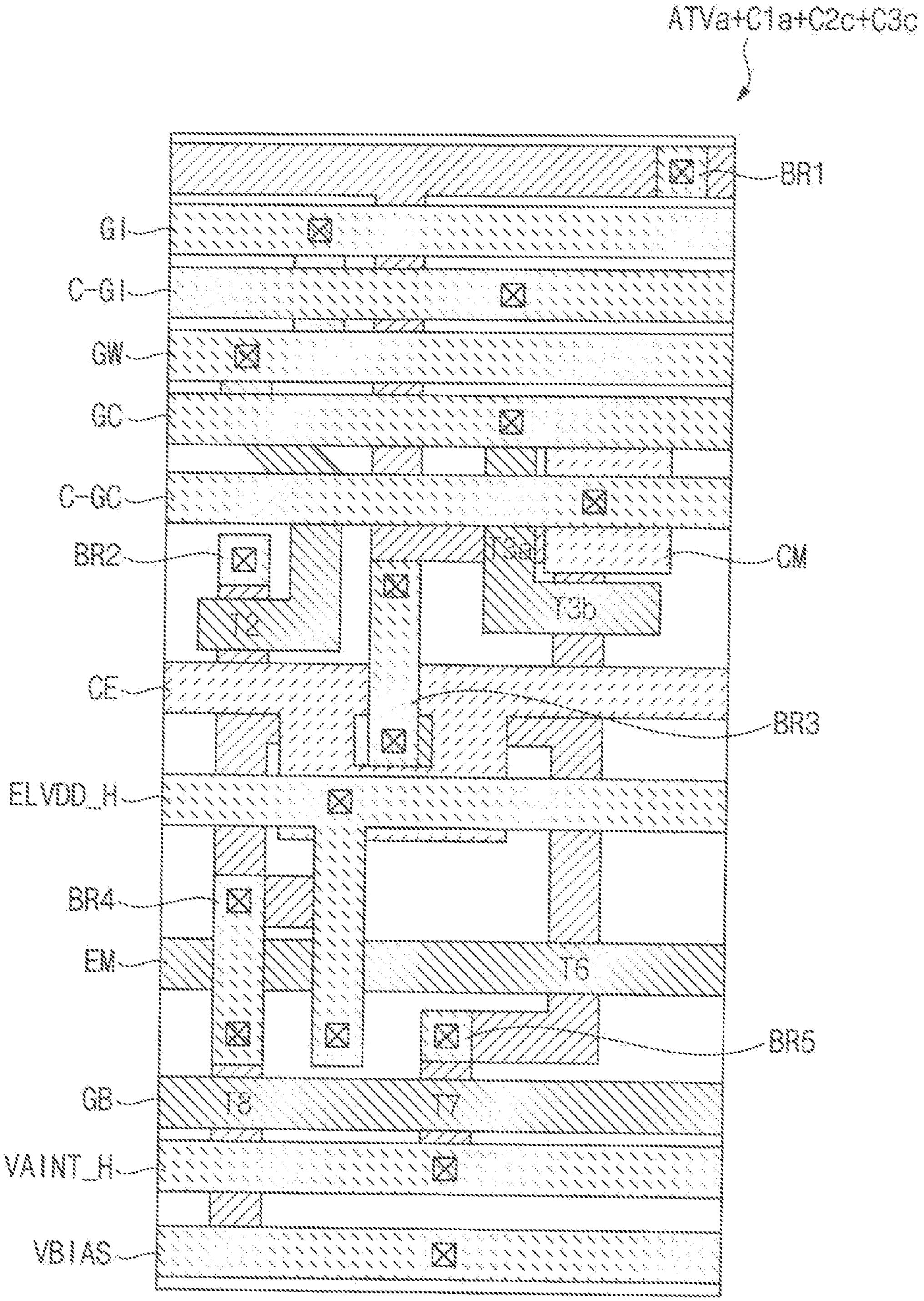

FIG. 16 is a plan view illustrating the active layer ATVa, the first conductive layer C1*a*, the second conductive layer C2*c*, and a third conductive layer C3*c* included in the pixel PXc of FIG. 14.

Referring to FIG. 16, the third conductive layer C3*c* may be located on the second conductive layer C2*c*. An insulation layer may be located between the third conductive layer C3*c* and the second conductive layer C2*c*. The third conductive layer C3*c* may include a conductive material.

The third conductive layer C3*c* may include a first bridge electrode BR1, a second bridge electrode BR2, a third bridge electrode BR3, a fourth bridge electrode BR4, a fifth bridge electrode BR5, a first gate voltage line GW, a second gate voltage line GC, the first compensation voltage line C-GC, the second compensation voltage line C-GI, a first horizontal power voltage line ELVDD_H, a horizontal light emitting initialization voltage line VAINT_H, and a bias voltage line VBIAS.

The first bridge electrode BR1, the second bridge electrode BR2, the third bridge electrode BR3, the fourth bridge electrode BR4, the fifth bridge electrode BR5, the first gate voltage line GW, the second gate voltage line GC, the first horizontal power voltage line ELVDD_H, the horizontal light emitting initialization voltage line VAINT_H, and the bias voltage line VBIAS included in the third conductive layer C3*c* may be substantially same as the first bridge electrode BR1, the second bridge electrode BR2, the third bridge electrode BR3, the fourth bridge electrode BR4, the fifth bridge electrode BR5, the first gate voltage line GW, the second gate voltage line GC, the first horizontal power voltage line ELVDD_H, the horizontal light emitting initialization voltage line VAINT_H, and the bias voltage line VBIAS described with reference to FIG. 6.

The first compensation voltage line C-GC included in the third conductive layer C3*c* may be substantially same as the first compensation voltage line C-GC described with reference to FIG. 6 and FIG. 7. That is, the first compensation voltage line C-GC may be connected to the first compensation electrode CM, and accordingly, the first compensation voltage line C-GC may provide the first compensation voltage line to the first compensation electrode CM.

The second compensation voltage line C-GI included in the third conductive layer C3*c* may be substantially same as the second compensation voltage line C-GI described with reference to FIG. 12 and FIG. 13. That is, the second compensation voltage line C-GI may be connected to the second compensation electrode CM', and accordingly, the second compensation voltage line C-GI may provide the second compensation voltage to the second compensation electrode CM'.

According to some embodiments, the fourth conductive layer C4*a* described with reference to FIG. 8 may be located on the third conductive layer C3*c*. In this case, an insulation layer may be located between the fourth conductive layer C4*a* and the third conductive layer C3*c*.

Figure 17:
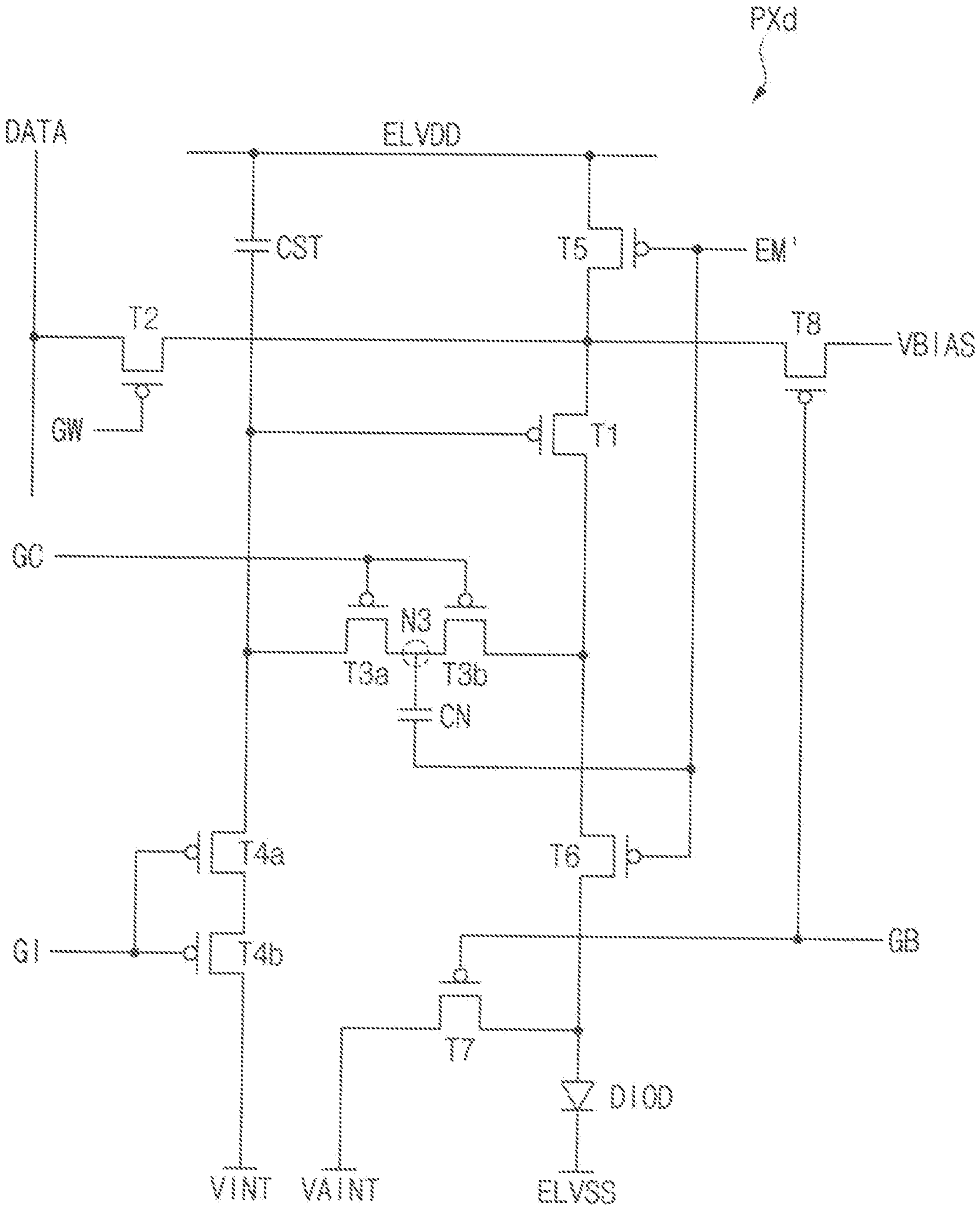
FIG. 17, FIG. 18, FIG. 19, FIG. 20, FIG. 21, and FIG. 22 are diagrams illustrating a display device according to some embodiments.

FIG. 17 is a circuit diagram illustrating a pixel included in a display device according to some embodiments.

Referring to FIG. 17, a display device according to some embodiments may include a pixel PXd.

The pixel PXd may be defined as a minimum unit for emitting light. The pixel PXd may include a pixel circuit and a light emitting element DIOD. The pixel circuit may include a plurality of transistors and at least one capacitor.

According to some embodiments, the pixel circuit may include a driving transistor, at least one switching transistor, and a storage capacitor CST. For example, the pixel circuit may include a first transistor T1 referred to as the driving transistor, a second transistor T2 providing a data voltage to the first transistor T1, a third transistor T3 electrically connecting an output electrode of the first transistor T1 and a gate electrode of the first transistor T1, the storage capacitor CST, and a first compensation capacitor CN. In this case, the pixel circuit may further include at least one of a fifth transistor T5 or a sixth transistor T6.

Optionally, the pixel circuit may further include at least one other switching transistor. For example, the pixel circuit may further include a fourth transistor T4, a seventh transistor T7, and an eight transistor T8.

Hereinafter, description substantially same as or similar to that described with reference to FIG. 1 may be omitted.

The third transistor T3 may include a first sub transistor T3*a* and a second sub transistor T3*b* electrically connected to the first sub transistor T3*a* through a first common node N3. In other words, the third transistor T3 may be a dual transistor having a dual gate structure. In this case, the third transistor T3 may be referred as a first dual transistor.

The fifth transistor T5 and the sixth transistor T6 may be referred to as a light emitting control transistor. According to some embodiments, the fifth transistor T5 may be referred to as a first light emitting control transistor, and the sixth transistor T6 may be referred to as a sixth light emitting control transistor.

A gate electrode of the fifth transistor T5 may be connected to a light emitting control line EM', and accordingly, the fifth transistor T5 may be turned on by a light emitting control voltage provided by the light emitting control line EM'.

A gate electrode of the sixth transistor T6 may be connected to the light emitting control line EM', and accordingly, the sixth transistor T6 may be turned on by the light emitting control voltage.

A first electrode of the first compensation capacitor CN may be connected to the first common node N3, and a second electrode of the first compensation capacitor CN may be connected to the light emitting control line EM'. The first compensation capacitor CN and the light emitting control line EM' may serve to maintain relatively constant voltage at the first common node N3. Accordingly, a leakage current of the third transistor T3 having the dual gate structure may be reduced, and low frequency characteristics of the display device may be relatively improved.

Figure 18:
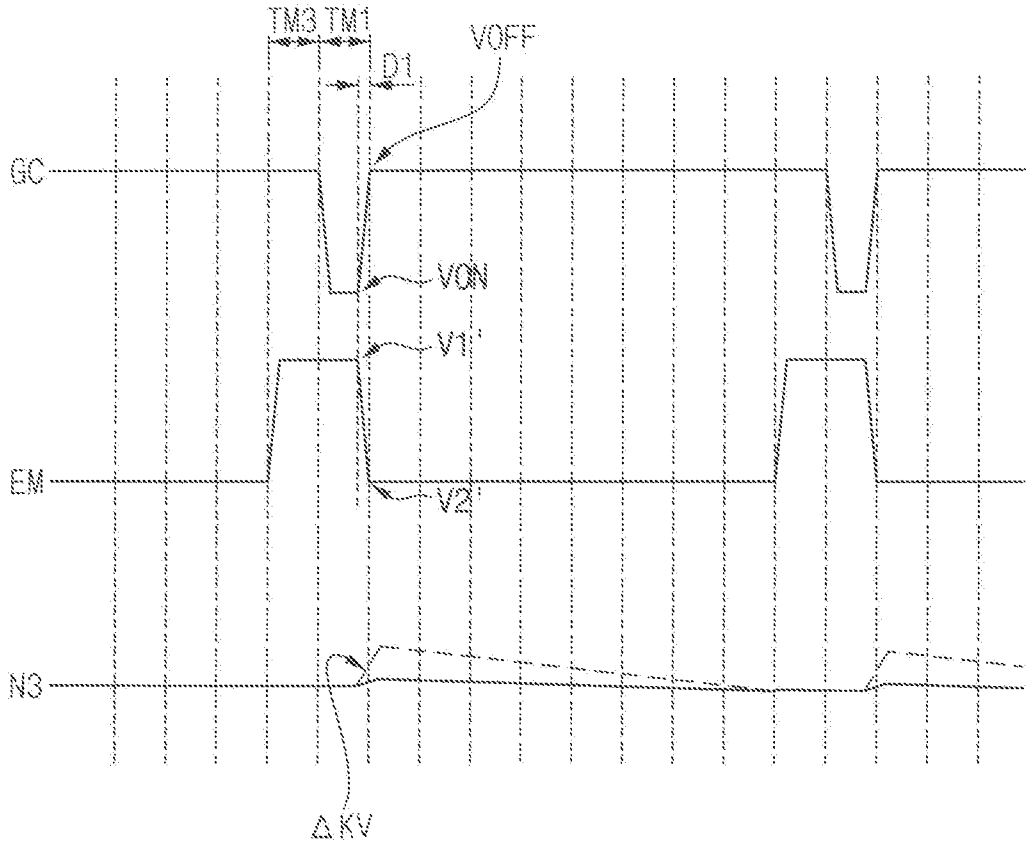

FIG. 18 is a waveform diagram illustrating an example in which the pixel of FIG. 17 operates. In FIG. 18, an example in which the first sub transistor T3*a*, the second sub transistor T3*b*, the fifth transistor T5, and the sixth transistor T6 are P-MOS transistors will be described, but the present invention is not limited thereto. For example, at least one of the first sub transistor T3*a*, the second sub transistor T3*b*, the fifth transistor T5, or the sixth transistor T6 may be N-MOS transistor.

Referring to FIG. 18, during a first timing TM1, a second gate voltage provided from a second gate voltage line GC may change from a first turn-off voltage VOFF to ta first turn-on voltage VON, and then change from the first turn-on voltage VON to the first turn-off voltage VOFF. The first turn-off voltage VOFF may be a voltage which turns off the first sub transistor T3*a* and the second sub transistor T3*b*, and the first turn-on voltage VON is a voltage which turns on the first sub transistor T3*a* and the second sub transistor T3*b*.

During a partial period (for example, a first period D1) of the first timing TM1 in which the second gate voltage changes from the first turn-on voltage VON to the first turn-off voltage VOFF, a voltage at the first common node N3 may increase (for example, a kick-back voltage increase AKV). A leakage current may occur in the first sub transistor T3*a* and the second sub transistor T3*b* due to the kick-back voltage increase AKV, and accordingly, a voltage at the gate electrode of the first transistor T1 may increase, so that a flicker phenomenon may occur.

According to some embodiments, the first compensation capacitor CN connected to the first common node N3 may form a capacitance in the first common node N3, and accordingly, the kick-back voltage increase AKV at the first common node N3 may be suppressed.

In addition, according to some embodiments, the light emitting control voltage may be provided to the second electrode of the first compensation capacitor CN. During a third timing TM3 before the first timing TM1, the light emitting control voltage provided from the light emitting control voltage line EM may change from a turn-on voltage to a turn-off voltage. During the first timing TM1, the light emitting control voltage may change from the turn-off voltage to turn-on voltage.

According to some embodiments, the light emitting control voltage provided from the light emitting control voltage line EM may change from a first voltage V1' to a second voltage V2' during the first period D1. In this case, a value obtained by multiplying a value obtained by subtracting the first voltage V1' from the second voltage V2' and a value obtained by subtracting the first turn-on voltage VON from the first turn-off voltage VOFF may have a negative value. Accordingly, the first compensation voltage may compensate the second gate voltage during the first period D1 to suppress the kick-back voltage increase AKV at the first common node N3.

Figure 19:
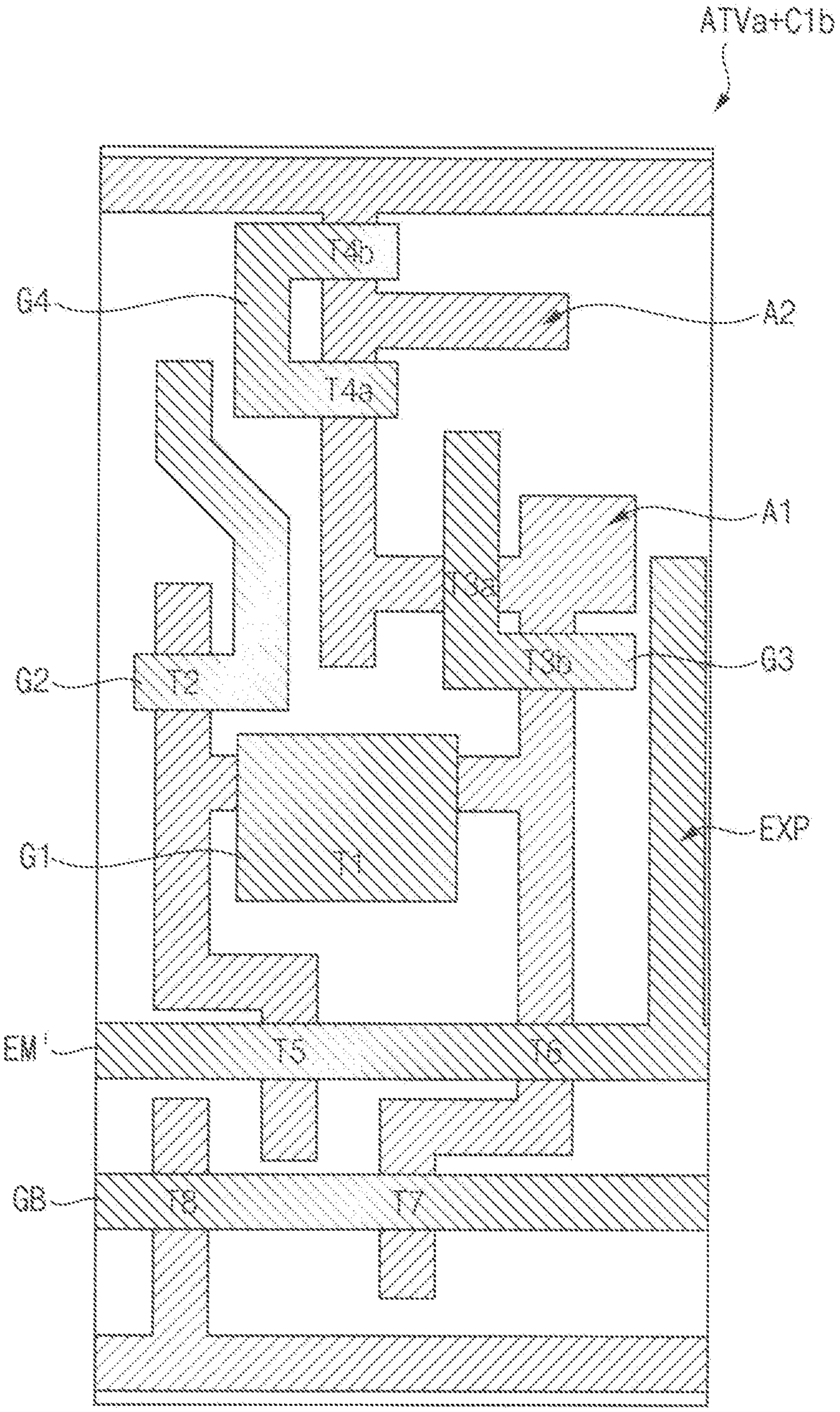

FIG. 19 is a plan view illustrating an active layer ATVa and a first conductive layer C1*b* included in the pixel PXd of FIG. 17.

Referring to FIG. 19, the pixel PXd may include the active layer ATVa and the first conductive layer C1*b*.

The active layer ATVa included in the pixel PXd may be substantially same as the active layer ATVa described with reference to FIG. 3 and FIG. 4.

The first conductive layer C1*b* may be located on the active layer ATVa. An insulation layer (for example, IL1 of FIG. 22) may be located between the first conductive layer C1*b* and the active layer ATVa. The first conductive layer C1*b* may include a conductive material.

The first conductive layer C1*b* may include a first gate electrode G1, a second gate electrode G2, a third gate electrode G3, a fourth gate electrode G4, the light emitting control line EM', and a fourth gate voltage line GB.

The first gate electrode G1, the second gate electrode G2, the third gate electrode G3, the fourth gate electrode G4, and the fourth gate voltage line GB included in the first conductive layer C1*b* may be substantially same as the first gate electrode G1, the second gate electrode G2, the third gate electrode G3, the fourth gate electrode G4, and the fourth gate voltage line GB described with reference to FIG. 3 and FIG. 4.

The light emitting control voltage may be provided to the light emitting control line EM'. In the light emitting control line EM', a portion overlapping the active layer ATVa may be the gate electrode of the fifth transistor T5 and the gate electrode of the sixth transistor T6. In addition, in the active layer ATVa, an area overlapping the light emitting control line EM' may define a channel area of the fifth transistor T5 and a channel area of the sixth transistor T6.

According to some embodiments, the light emitting control line EM' may include an extension portion EXP. The extension portion EXP may extends in a direction crossing the extension direction of the light emitting control line EM'. In this case, a portion of the extension portion EXP may be adjacent to the first common area A1 of the active layer ATVa.

Figure 20:
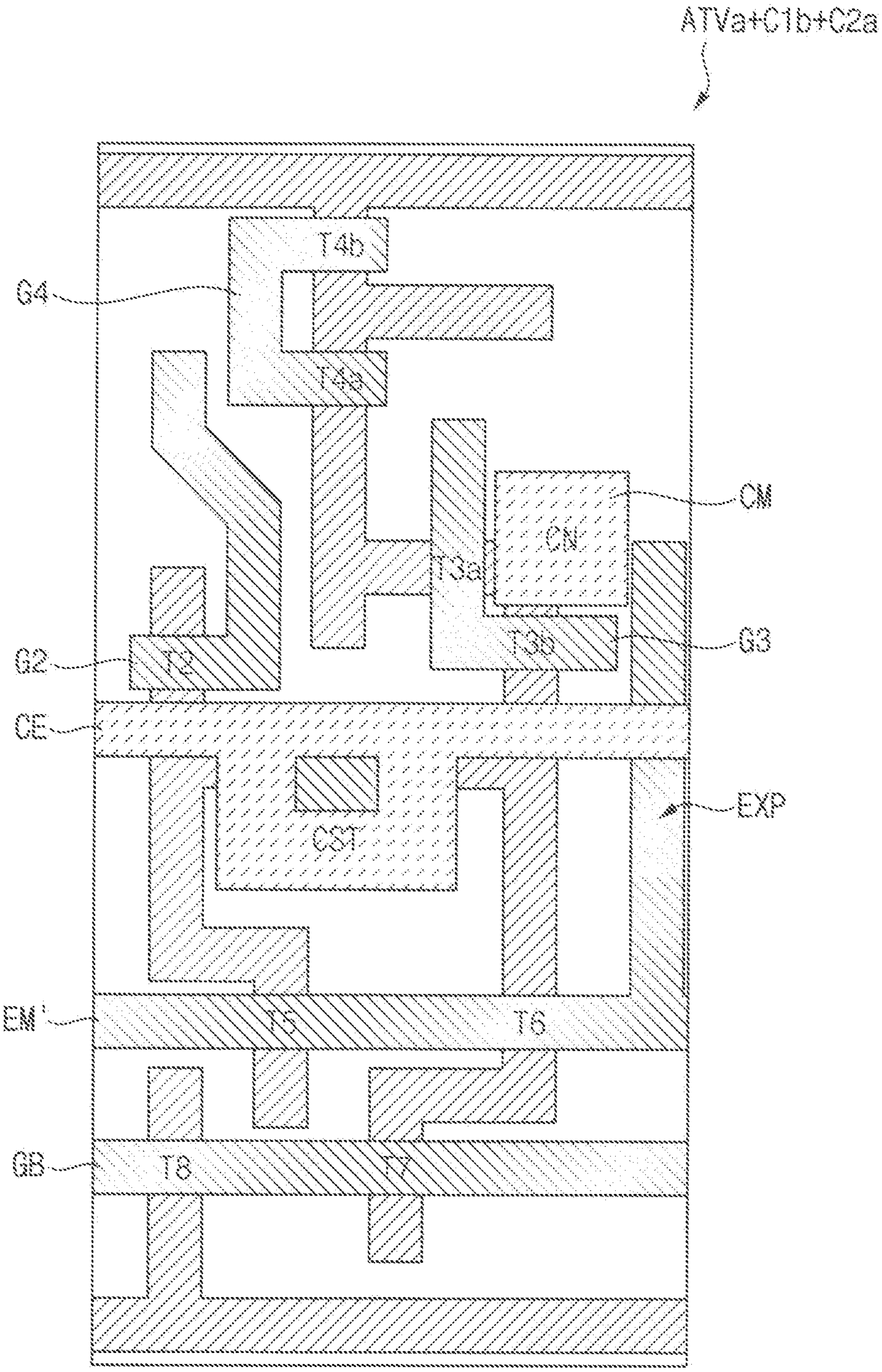

FIG. 20 is a plan view illustrating the active layer ATVa, the first conductive layer C1*b*, and a second conductive layer C2*a* included in the pixel PXd.

Referring to FIG. 20, the second conductive layer C2*a* may be located on the first conductive layer C1*b*. The second conductive layer C2*a* included in the pixel PXd may be substantially same as the second conductive layer C2*a* described with reference to FIG. 5. For example, the second conductive layer C2*a* may include the first compensation electrode CM overlapping the first common area A1 of the active layer ATVa to define the first compensation capacitor CN.

Figure 21:
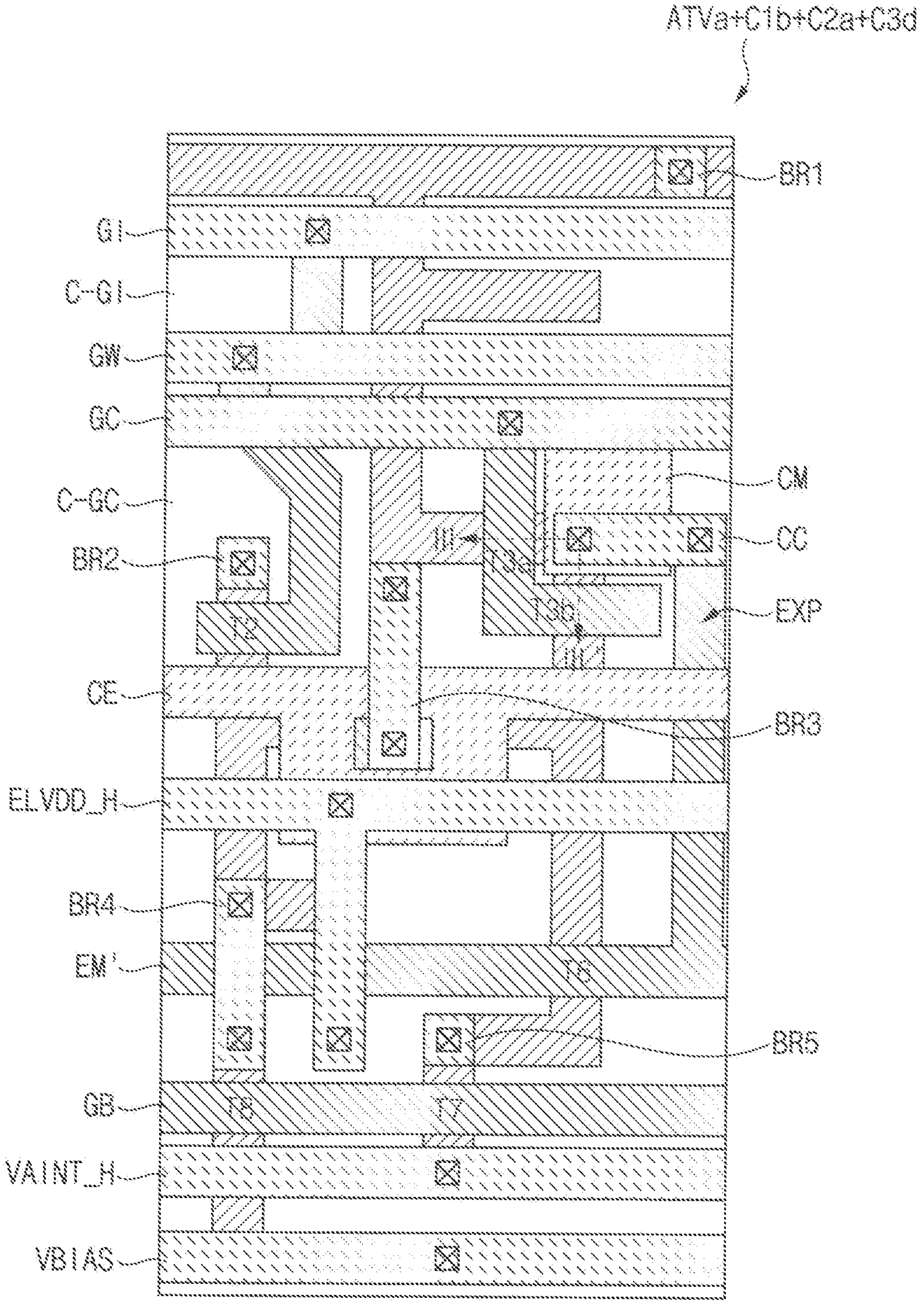

FIG. 21 is a plan view illustrating the active layer ATVa, the first conductive layer C1*b*, the second conductive layer C2*a*, and a third conductive layer C3*d* included in the pixel PXd.

Referring to FIG. 21, the third conductive layer C3*d* may be located on the second conductive layer C2*a*. An insulation layer (for example, IL3 of FIG. 22) may be located between the third conductive layer C3*d* and the second conductive layer C2*a*. The third conductive layer C3*d* may include a conductive material.

The third conductive layer C3*d* may include a first bridge electrode BR1, a second bridge electrode BR2, a third bridge electrode BR3, a fourth bridge electrode BR4, a fifth bridge electrode BR5, a first gate voltage line GW, a second gate voltage line GC, a third gate voltage line GI, a connection electrode CC, a first horizontal power voltage line ELVDD_H, a horizontal light emitting initialization voltage line VAINT_H, and a bias voltage line VBIAS.

The first bridge electrode BR1, the second bridge electrode BR2, the third bridge electrode BR3, the fourth bridge electrode BR4, the fifth bridge electrode BR5, the first gate voltage line GW, the second gate voltage line GC, the third gate voltage line GI, the first horizontal power voltage line ELVDD_H, the horizontal light emitting initialization voltage line VAINT_H, and the bias voltage line VBIAS included in the third conductive layer C3*d* may be substantially same as the first bridge electrode BR1, the second bridge electrode BR2, the third bridge electrode BR3, the fourth bridge electrode BR4, the fifth bridge electrode BR5, the first gate voltage line GW, the second gate voltage line GC, the third gate voltage line GI, the first horizontal power voltage line ELVDD_H, the horizontal light emitting initialization voltage line VAINT_H, and the bias voltage line VBIAS described with reference to FIG. 6.

The connection electrode CC may connect the first compensation electrode CM and the light emitting control line EM'. According to some embodiments, the connection electrode CC may connect the first compensation electrode CM and the extension portion EXP of the light emitting control line EM'. Accordingly, the light emitting control voltage provided by the light emitting control line EM' may be provided to the first compensation electrode CM through the connection electrode CC.

According to some embodiments, the fourth conductive layer C4*a* described with reference to FIG. 8 may be located on the third conductive layer C3*d*. In this case, an insulation layer may be located between the fourth conductive layer C4*a* and the third conductive layer C3*d*.

Figure 22:
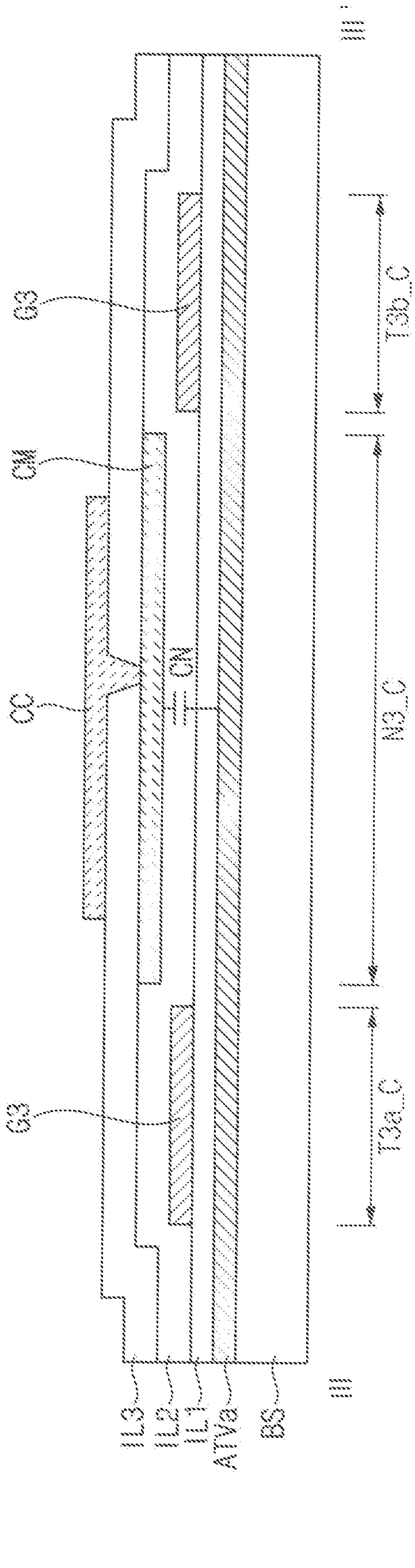

FIG. 22 is a cross-sectional view taken along a line III-III' of FIG. 21.

Referring to FIG. 22, the pixel PXd may include a base substrate BS, the active layer ATVa, a first insulation layer IL1, the third gate electrode G3, a second insulation layer IL2, the first compensation electrode CM, a third insulation layer IL3, and the connection electrode CC.

The base substrate BS may include glass, plastic, etc. According to some embodiments, the base substrate BS may include a material having flexibility, and accordingly, the base substrate BS may have flexibility.

The active layer ATVa may be located on the base substrate BS, and the first insulation layer IL1 may be located on the active layer ATVa. The first insulation layer IL1 may include an inorganic insulation material.

The third gate electrode G3 may be located on the first insulation layer IL1, and the second insulation layer IL2 may be located on the third gate electrode G3. The second insulation layer IL2 may include an inorganic insulation material.

The first compensation electrode CM may be located on the second insulation layer IL2, and the third insulation layer IL3 may be located on the first compensation electrode CM. The third insulation layer IL3 may include an inorganic insulation material.

The connection electrode CC may be located on the third insulation layer IL3. The connection electrode CC may be connected to the first compensation electrode CM through a through hole penetrating the third insulation layer IL3 and exposing at least a portion of the first compensation electrode CM.

In the active layer ATVa, an area overlapping the third gate electrode G3 may define a channel area T3*a*_C of the first sub transistor T3*a* and a channel area T3*b*_C of the second sub transistor T3*b*.

In addition, in the first common area A1 of the active layer ATVa, an area overlapping the first compensation electrode CM may define a first overlapping area N3_C. The first overlapping area N3_C may be the first electrode of the first compensation capacitor CN. In this case, as a planar area of the first overlapping area N3_C increases, a capacitance of the first compensation capacitor CN may increase.

According to some embodiments, the planar area of the first overlapping area N3_C may be relatively large so that the first compensation capacitor CN may have a relatively large capacitance. For example, the planar area of the first overlapping area N3_C may be larger than sum of a planar area of the channel area T3*a*_C of the first sub transistor T3*a* and a planar area of the channel area T3*b*_C of the second sub transistor T3*b*.

As described above, as the first compensation capacitor CN has a relatively large capacitance, the kick-back voltage increase AKV may be effectively suppressed.

Figure 23:
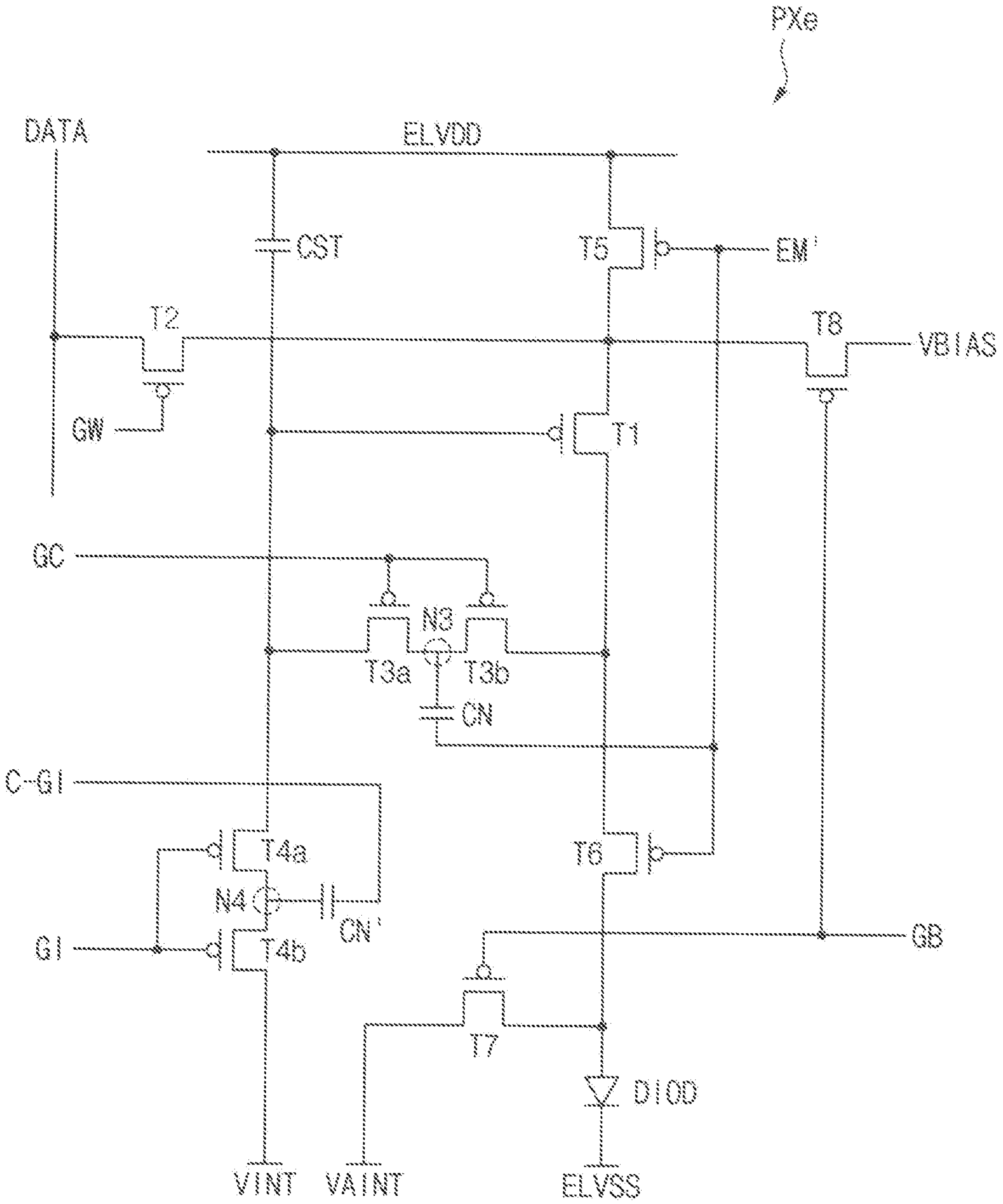
FIG. 23, FIG. 24, and FIG. 25 are diagrams illustrating a display device according to some embodiments.

FIG. 23 is a circuit diagram illustrating a pixel included in a display device according to some embodiments.

Referring to FIG. 23, a display device according to some embodiments may include a pixel PXe.

The pixel PXe may be defined as a minimum unit for emitting light. The pixel PXe may include a pixel circuit and a light emitting element DIOD. The pixel circuit may include a plurality of transistors and at least one capacitor.

According to some embodiments, the pixel circuit may include a driving transistor, at least one switching transistor, and a storage capacitor CST. For example, the pixel circuit may include a first transistor T1 referred to as the driving transistor, a second transistor T2 providing a data voltage to the first transistor T1, a third transistor T3 electrically connecting an output electrode of the first transistor T1 and a gate electrode of the first transistor T1, a fourth transistor T4 electrically connecting a gate electrode of the first transistor T1 and an initialization voltage line VINT, the storage capacitor CST, a first compensation capacitor CN, and a second compensation capacitor CN'. In this case, the pixel circuit may further include at least one of the fifth transistor T5 or the sixth transistor T6.

Optionally, the pixel circuit may further include at least one other switching transistor. For example, the pixel circuit may further include a seventh transistor T7, and an eight transistor T8.

Hereinafter, description substantially same as or similar to that described with reference to FIG. 1, FIG. 9, and FIG. 17 may be omitted.

The third transistor T3 may include a first sub transistor T3*a* and a second sub transistor T3*b* electrically connected to the first sub transistor T3*a* through a first common node N3. In other words, the third transistor T3 may be a dual transistor having a dual gate structure. In this case, the third transistor T3 may be referred as a first dual transistor.

A first electrode of the first compensation capacitor CN may be connected to the first common node N3, and a second electrode of the first compensation capacitor CN may be connected to a light emitting control line EM' providing a light emitting control voltage.

The third transistor T3, the first compensation capacitor CN, and the light emitting control line EM' include in the pixel PXe may be substantially same as the third transistor T3, the first compensation capacitor CN, and the light emitting control line EM' described with reference to FIG. 17.

The first compensation capacitor CN and the light emitting control line EM' may serve to maintain relatively constant voltage at the first common node N3 (Refer to FIG. 18). Accordingly, a leakage current of the third transistor T3 having the dual gate structure may be reduced, and low frequency characteristics of the display device may be relatively improved.

The fourth transistor T4 may include a third sub transistor T4*a* and a fourth sub transistor T4*b*. The third sub transistor T4*a* and the fourth sub transistor T4*b* may be electrically connected to each other through a second common node N4. In other words, the fourth transistor T4 may be a dual transistor having a dual gate structure.

A first electrode of the second compensation capacitor CN' may be connected to the second common node N4, and a second electrode of the second compensation capacitor CN' may be connected to a second compensation voltage line C-GI providing a second compensation voltage.

The fourth transistor T4, the second compensation capacitor CN', and the second compensation voltage line C-GI included in the pixel PXe may be substantially same as the fourth transistor T4, the second compensation capacitor CN', and the second compensation voltage line C-GI described with reference to FIG. 9.

The second compensation capacitor CN' and the second compensation voltage line C-GI may serve to maintain relatively constant voltage at the second common node N4 (Refer to FIG. 10). Accordingly, a leakage current of the fourth transistor T4 having the dual gate structure may be reduced, and low frequency characteristics of the display device may be relatively improved.

Figure 24:
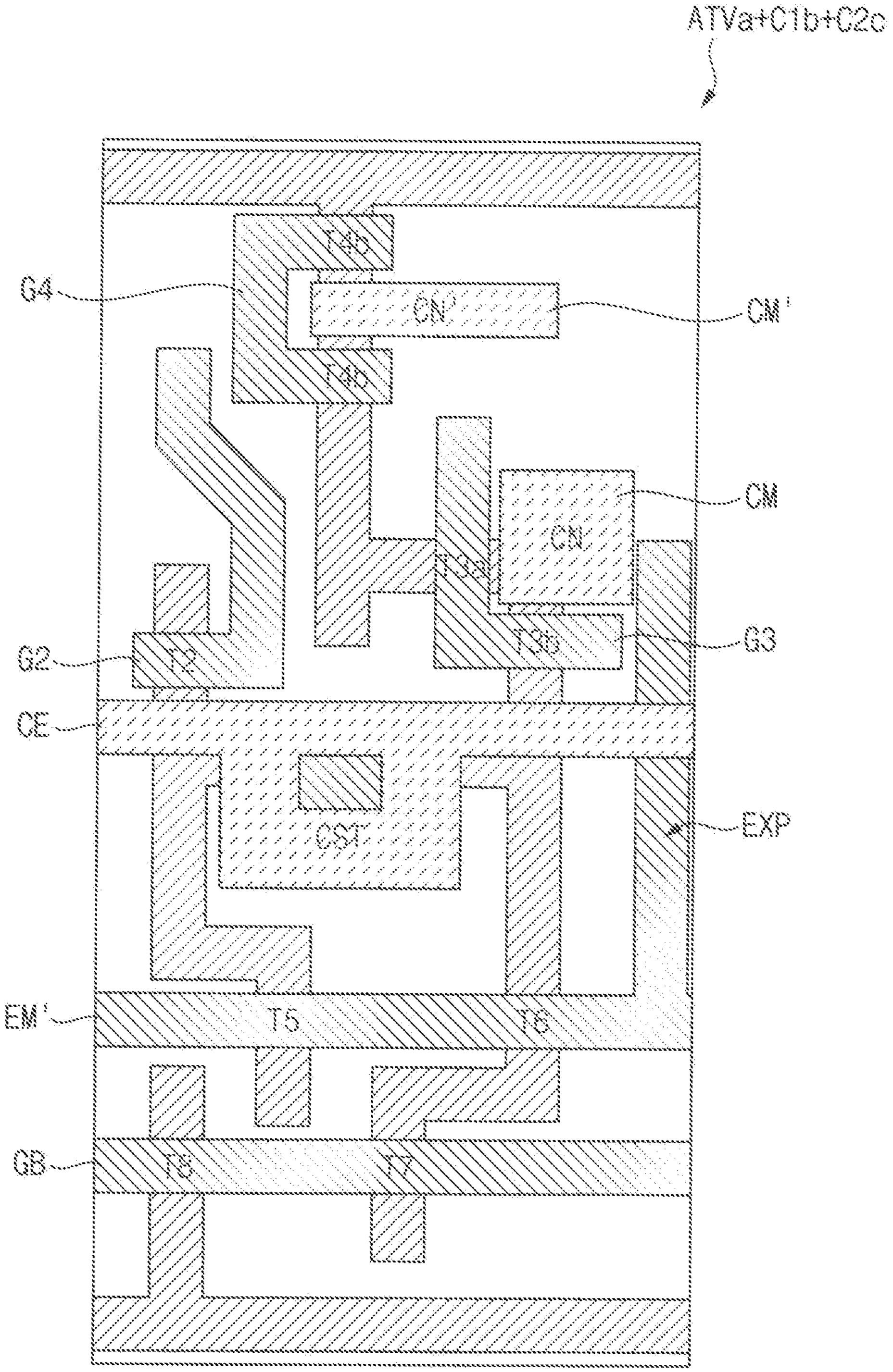

FIG. 24 is a plan view illustrating an active layer ATVa, a first conductive layer C1*b*, and a second conductive layer C2*c* included in the pixel PXe of FIG. 23.

Referring to FIG. 24, the pixel PXe may include the active layer ATVa, the first conductive layer C1*b*, and the second conductive layer C2*c*.

The active layer ATVa included in the pixel PXe may be substantially same as the active layer ATVa described with reference to FIG. 3 and FIG. 4.

The first conductive layer C1*b* included in the pixel PXe may be substantially same as the first conductive layer C1*b* described with reference to FIG. 19. For example, the first conductive layer C1*b* may include the light emitting control line EM' to which the light emitting control voltage is provided.

The second conductive layer C2*c* included in the pixel PXe may be substantially same as the second conductive layer C2*c* described with reference to FIG. 15. For example, the second conductive layer C2*c* may include a first compensation electrode CM overlapping the first common area A1 of the active layer ATVa to define the first compensation capacitor CN, and the second compensation electrode CM' overlapping the second common area A2 of the active layer ATVa to define the second compensation capacitor CN'.

Figure 25:
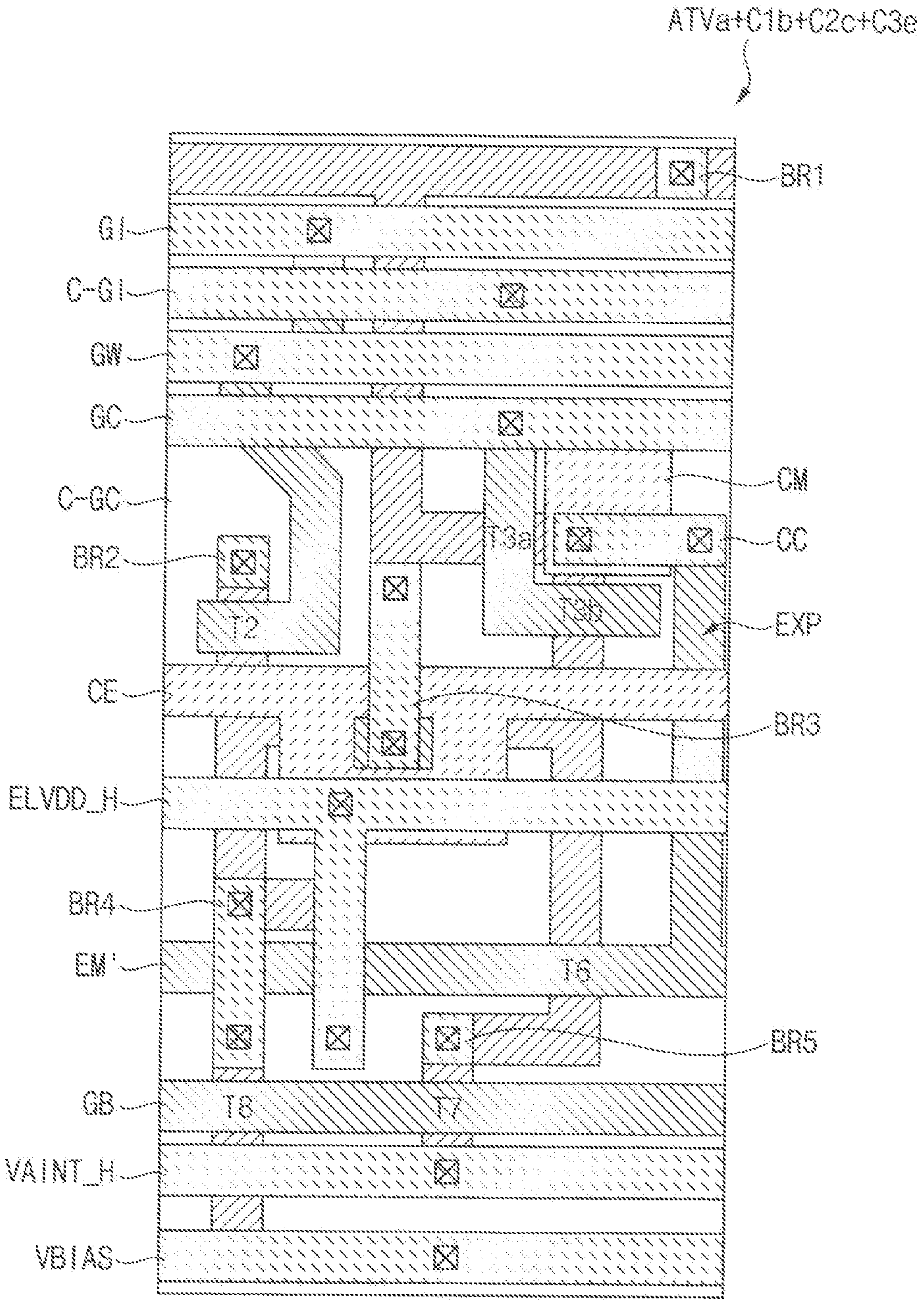

FIG. 25 is a plan view illustrating the active layer ATVa, the first conductive layer C1*b*, the second conductive layer C2*c*, and a third conductive layer C3*e* included in the pixel PXe.

Referring to FIG. 25, the third conductive layer C3*e* may be located on the second conductive layer C2*c*. An insulation layer may be located between the third conductive layer C3*e* and the second conductive layer C2*c*. The third conductive layer C3*e* may include a conductive material.

The third conductive layer C3*e* may include a first bridge electrode BR1, a second bridge electrode BR2, a third bridge electrode BR3, a fourth bridge electrode BR4, a fifth bridge electrode BR5, a first gate voltage line GW, a second gate voltage line GC, a third gate voltage line GI, a connection electrode CC, the second compensation voltage line C-GI, a first horizontal power voltage line ELVDD_H, a horizontal light emitting initialization voltage line VAINT_H, and a bias voltage line VIBAS.

The first bridge electrode BR1, the second bridge electrode BR2, the third bridge electrode BR3, the fourth bridge electrode BR4, the fifth bridge electrode BR5, the first gate voltage line GW, the second gate voltage line GC, the third gate voltage line GI, the first horizontal power voltage line ELVDD_H, the horizontal light emitting initialization voltage line VAINT_H, and the bias voltage line VIBAS included in the third conductive layer C3*e* may be substantially same as the first bridge electrode BR1, the second bridge electrode BR2, the third bridge electrode BR3, the fourth bridge electrode BR4, the fifth bridge electrode BR5, the first gate voltage line GW, the second gate voltage line GC, the third gate voltage line GI, the first horizontal power voltage line ELVDD_H, the horizontal light emitting initialization voltage line VAINT_H, and the bias voltage line VIBAS described with reference to FIG. 6.

The connection electrode CC included in the third conductive layer C3*e* may be substantially same as the connection electrode CC described with reference to FIG. 21 and FIG. 22. That is, the connection electrode CC may be connected to the first compensation electrode CM and the light emitting control line EM', and accordingly, the light emitting control voltage provided by the light emitting control line EM' may be provided to the first compensation electrode CM through the connection electrode CC.

The second compensation voltage line C-GI included in the third conductive layer C3*e* may be substantially same as the second compensation voltage line C-GI described with reference to FIG. 12 and FIG. 13. That is, the second compensation voltage line C-GI may be connected to the second compensation electrode CM', and accordingly, the second compensation voltage provided by the second compensation voltage line C-GI may be provided to the second compensation electrode CM'.

According to some embodiments, the fourth conductive layer C4*a* described with reference to FIG. 8 may be located on the third conductive layer C3*e*. In this case, an insulation layer may be located between the fourth conductive layer C4*a* and the third conductive layer C3*e*.

The foregoing is illustrative of embodiments and is not to be construed as limiting thereof. Although a few embodiments have been described, those skilled in the art will readily appreciate that many modifications are possible in the embodiments without materially departing from the novel teachings and characteristics of embodiments according to the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims, and their equivalents.

What is claimed is:

1. A display device comprising:

a light emitting element;

a driving transistor configured to transmit a driving current to the light emitting element;

a first dual transistor comprising a first sub transistor connected to a gate electrode of the driving transistor, and a second sub transistor configured to connect an input electrode of the first sub transistor and an output electrode of the driving transistor, wherein the first dual transistor is configured to be turned on by a gate voltage and the first dual transistor includes a gate electrode;

an active layer comprising a first common area defining the input electrode of the first sub transistor and an output electrode of the second sub transistor;

a first compensation electrode overlapping at least a portion of the first common area to define a first compensation capacitor, wherein the first compensation electrode is spaced apart from the gate electrode of the first dual transistor; and a first compensation voltage line configured to provide a first compensation voltage, different from the gate voltage, to the first compensation electrode.

2. The display device of claim 1, wherein during a first period in which the gate voltage applied to the gate electrode of the first dual transistor changes from a first turn-on voltage to a first turn-off voltage, the first compensation voltage changes from a first voltage to a second voltage, and a value obtained by multiplying a value obtained by subtracting the first voltage from the second voltage and a value obtained by subtracting the first turn-on voltage from the first turn-off voltage has a negative value.

3. The display device of claim 1, wherein a planar area of an area where the first common area and the first compensation electrode overlap each other is larger than a planar area of an area where the active layer and the gate electrode of the first dual transistor overlap each other.

4. The display device of claim 1, further comprising:

a second dual transistor comprising a third sub transistor connected to the gate electrode of the driving transistor, and a fourth sub transistor connected to an input electrode of the third sub transistor and an initialization voltage line.

5. The display device of claim 4, wherein an output electrode of the third sub transistor is connected to an output electrode of the first sub transistor.

6. The display device of claim 4, wherein the active layer further comprises a second common area defining the input electrode of the third sub transistor and an output electrode of the fourth sub transistor.

7. The display device of claim 6, further comprising:

a second compensation electrode overlapping at least a portion of the second common area to define a second compensation capacitor; and a second compensation voltage line configured to provide a second compensation voltage to the second compensation electrode, and spaced apart from the first compensation voltage line.

8. The display device of claim 7, wherein during a second period in which a voltage applied to a gate electrode of the second dual transistor changes from a second turn-on voltage to a second turn-off voltage, the second compensation voltage changes from a third voltage to a fourth voltage, and a value obtained by multiplying a value obtained by subtracting the third voltage from the fourth voltage and a value obtained by subtracting the second turn-on voltage from the second turn-off voltage has a negative value.

9. A display device comprising:

a light emitting element;

a driving transistor configured to transmit a driving current to the light emitting element;

a second dual transistor comprising a third sub transistor connected to a gate electrode of the driving transistor, and a fourth sub transistor connected to an input electrode of the third sub transistor and an initialization voltage line, wherein the second dual transistor is configured to be turned on by a gate voltage and the second dual transistor includes a gate electrode;

an active layer comprising a second common area defining the input electrode of the third sub transistor and an output electrode of the fourth sub transistor;

a compensation electrode overlapping at least a portion of the second common area to define a compensation capacitor, wherein the compensation electrode is spaced apart from the gate electrode of the second dual transistor; and a compensation voltage line configured to provide a compensation voltage, different from the gate voltage, to the compensation electrode.

10. The display device of claim 9, wherein during a second period in which the gate voltage applied to the gate electrode of the second dual transistor changes from a second turn-on voltage to a second turn-off voltage, the compensation voltage changes from a third voltage to a fourth voltage, and a value obtained by multiplying a value obtained by subtracting the third voltage from the fourth voltage and a value obtained by subtracting the second turn-on voltage from the second turn-off voltage has a negative value.

11. The display device of claim 9, wherein a planar area of an area where the second common area and the compensation electrode overlap each other is larger than a planar area of an area where the active layer and the gate electrode of the second dual transistor overlap each other.

* * * * *